(12) United States Patent
Larsen et al.

(10) Patent No.: US 8,310,021 B2
(45) Date of Patent: Nov. 13, 2012

(54) NEUTRON DETECTOR WITH WAFER-TO-WAFER BONDING

(75) Inventors: Bradley J. Larsen, Mound, MN (US); Todd A. Randazzo, Plymouth, MN (US)

(73) Assignee: Honeywell International Inc., Morristown, NJ (US)

( * ) Notice: Subject to any disclaimer, the term of this patent is extended or adjusted under 35 U.S.C. 154(b) by 167 days.

(21) Appl. No.: 12/835,313

(22) Filed: Jul. 13, 2010

(65) Prior Publication Data

US 2012/0012957 A1    Jan. 19, 2012

(51) Int. Cl.
*H01L 31/115* (2006.01)
(52) U.S. Cl. ......... 257/429; 257/E31.086; 257/E21.211; 438/56
(58) Field of Classification Search .................. 257/429, 257/E21.211, E31.086; 438/56
See application file for complete search history.

(56) References Cited

U.S. PATENT DOCUMENTS

| | | |
|---|---|---|
| 4,419,578 A | 12/1983 | Kress |
| 4,445,036 A | 4/1984 | Selph |
| 4,609,520 A | 9/1986 | Kronenberg |
| 4,737,234 A | 4/1988 | Ruddy |
| 4,757,202 A | 7/1988 | East |
| 4,874,951 A | 10/1989 | Gold et al. |
| 5,315,544 A | 5/1994 | Yokote et al. |
| 5,331,164 A | 7/1994 | Buehler et al. |
| 5,562,769 A | 10/1996 | Dreifus et al. |
| 5,726,453 A | 3/1998 | Lott et al. |
| 5,807,783 A | 9/1998 | Gaul et al. |
| 5,821,541 A | 10/1998 | Tümer |
| 5,940,460 A | 8/1999 | Seidel et al. |
| 5,969,359 A | 10/1999 | Ruddy et al. |
| 6,075,261 A | 6/2000 | Hossain et al. |
| 6,252,923 B1 | 6/2001 | Iacovino et al. |
| 6,259,099 B1 | 7/2001 | Foulon et al. |
| 6,355,501 B1 | 3/2002 | Fung et al. |
| 6,387,724 B1 | 5/2002 | Walker |

(Continued)

FOREIGN PATENT DOCUMENTS

EP    0 709 854 A1    5/1996

(Continued)

OTHER PUBLICATIONS

International Search Report and Written Opinion from counterpart PCT Application Serial No. PCT/US2011/043007, 9 pages, mailed Jan. 10, 2012.

(Continued)

*Primary Examiner* — Trung Q Dang
(74) *Attorney, Agent, or Firm* — Shumaker & Sieffert, P.A.

(57) ABSTRACT

A method of manufacturing a neutron detector comprises forming a first wafer by at least forming an oxide layer on a substrate, forming an active semiconductor layer on the oxide layer, and forming an interconnect layer on the active semiconductor layer, forming at least one electrically conductive pathway extending from the interconnect layer through the active semiconductor layer and the oxide layer, forming a circuit transfer bond between the interconnect layer and a second wafer, removing the substrate of the first wafer after forming the circuit transfer bond, depositing a bond pad on the oxide layer after removing the substrate of the first wafer, wherein the bond pad is electrically connected to the electrically conductive pathway, depositing a barrier layer on the oxide layer after removing the substrate of the first wafer, and depositing a neutron conversion layer on the barrier layer after depositing the barrier layer.

18 Claims, 14 Drawing Sheets

U.S. PATENT DOCUMENTS

| | | | |
|---|---|---|---|
| 6,388,260 B1 | 5/2002 | Doty et al. | |
| 6,423,972 B1 | 7/2002 | Fehrenbacher et al. | |
| 6,479,826 B1 | 11/2002 | Klann et al. | |
| 6,542,565 B2 | 4/2003 | Ruddy et al. | |
| 6,545,281 B1 | 4/2003 | McGregor et al. | |
| 6,596,998 B1 | 7/2003 | Siedel | |
| 6,627,898 B2 | 9/2003 | Seidel et al. | |
| 6,714,616 B1 | 3/2004 | Kronenberg et al. | |
| 6,727,504 B1 | 4/2004 | Doty | |
| 6,771,730 B1 | 8/2004 | Dowben et al. | |
| 6,867,444 B1 | 3/2005 | Hughes | |
| 6,921,903 B2 | 7/2005 | McGregor | |
| 6,933,503 B2 | 8/2005 | Sipilä et al. | |
| 7,070,658 B2 | 7/2006 | Guido et al. | |
| 7,075,165 B2 | 7/2006 | Leon et al. | |
| 7,105,832 B2 | 9/2006 | Dai et al. | |
| 7,142,109 B1 | 11/2006 | Frank | |
| 7,160,753 B2 | 1/2007 | Williams, Jr. | |
| 7,164,138 B2 | 1/2007 | McGregor et al. | |
| 7,271,389 B2 | 9/2007 | August et al. | |
| 7,332,726 B2 | 2/2008 | Friedman et al. | |
| 7,365,436 B2 | 4/2008 | Yamano | |
| 7,372,009 B1 | 5/2008 | Losee et al. | |
| 7,378,702 B2 | 5/2008 | Lee | |
| 7,465,937 B2 | 12/2008 | Fehrenbacher | |
| 7,470,598 B2 | 12/2008 | Lee | |
| 7,485,511 B2 | 2/2009 | Yamada et al. | |
| 7,514,694 B2 | 4/2009 | Stephan et al. | |
| 7,518,119 B2 | 4/2009 | Friedman et al. | |
| 7,572,392 B2 | 8/2009 | Clothier et al. | |
| 7,576,369 B2 | 8/2009 | Bui et al. | |
| 7,635,849 B2 | 12/2009 | Klein et al. | |
| 7,791,031 B2* | 9/2010 | Keyser et al. | 250/370.05 |
| 7,902,513 B2* | 3/2011 | Kub et al. | 250/370.05 |
| 8,120,131 B2* | 2/2012 | Cannon et al. | 257/444 |
| 2004/0148337 A1 | 7/2004 | Duncan | |
| 2004/0227094 A1 | 11/2004 | Tompa et al. | |
| 2006/0255282 A1 | 11/2006 | Nikolic et al. | |
| 2007/0018110 A1 | 1/2007 | McGregor et al. | |
| 2007/0023888 A1 | 2/2007 | Fujii | |
| 2008/0017804 A1 | 1/2008 | Krishnamoorthy et al. | |
| 2008/0258057 A1 | 10/2008 | Williamson et al. | |
| 2008/0296506 A1 | 12/2008 | Clarke et al. | |
| 2009/0057545 A1 | 3/2009 | Saenger et al. | |
| 2009/0072141 A1 | 3/2009 | Satoh et al. | |
| 2009/0096113 A1 | 4/2009 | Randazzo et al. | |
| 2009/0166550 A1 | 7/2009 | Gazda et al. | |
| 2009/0302226 A1 | 12/2009 | Schieber et al. | |
| 2009/0302227 A1 | 12/2009 | Keyser et al. | |
| 2010/0019164 A1 | 1/2010 | Stephan et al. | |
| 2010/0155611 A1 | 6/2010 | Fullwood et al. | |
| 2010/0159671 A1 | 6/2010 | Keyser | |

FOREIGN PATENT DOCUMENTS

| | | |
|---|---|---|
| EP | 1 729 149 A1 | 12/2006 |
| JP | 54-141186 | 11/1979 |
| JP | 7176777 | 7/1995 |
| JP | 2002/267760 | 9/2002 |
| JP | 2004/219165 | 8/2004 |
| KR | 20100030342 | 3/2010 |
| WO | 00/33106 | 6/2000 |
| WO | 2005/003816 A2 | 1/2005 |
| WO | 2008/107017 A1 | 9/2008 |
| WO | 2009/117477 A2 | 9/2009 |

OTHER PUBLICATIONS

B. Dierickx et al., "Integration of CMOS-Electronics and Particle Detector Diodes in High-Resistivity Silicon-On-Insulator Wafers," IEEE Transactions on Nuclear Science, vol. 40, No. 4, Aug. 1993, pp. 753-758.

D.S. McGregor et al., "Recent Results From Thin-Film-Coated Semiconductor Neutron Detectors," Proc. of SPIE, 2002, 19 pp.

B.W. Robertson et al., "A Class of Boron-Rich Solid-State Neutron Detectors," Research Papers in Physics and Astronomy, Peter Dowben Publications, University of Nebraska, Lincoln, Applied Physics Letters, vol. 80, No. 19, May 2002, 4 pp.

Jerome Baron, "Back-Side Illumination, Wafer-Scale Optics Drive 2X-5X Jump in CMOS Image Sensor Performance," May 24, 2010, 5 pp., downloaded from http://www.electroiq.com/ElectroIQ/enus/index/display/Nanotech_Article_Tools_Template.articles.small-times.nanotechmems.mems.sensors.2010.may.back-sideillumination.html.

Shultis et al., "Efficiencies of Coated and Perforated Semiconductor Neutron Detectors," IEEE Transactions on Nuclear Science, vol. 53, No. 3, pp. 1659-1665, Jun. 2006.

Bruckner et al., "Position Sensitive Detection of Thermal Neutrons with Solid State Detectors (Gd Si Planar Detectors)", Nuclear Instruments and Methods in Physics Research A 424 (1999), pp. 183-189.

* cited by examiner

NEUTRON DETECTOR WITH WAFER-TO-WAFER BONDING

TECHNICAL FIELD

The disclosure is generally directed to semiconductor devices.

BACKGROUND

Neutron particle detection is a method for fissile nuclear material detection. Because neutrons have no electrical charge, their detection generally relies on their participation in nuclear reactions. Some neutron detectors include gas-filled tubes containing neutron-sensitive material, such as either $^3$He or $BF_3$ gas, which reacts with neutrons to form secondary charged particles that can subsequently be detected through ionization. Such gas-filled proportional neutron detectors can be relatively expensive, relatively bulky, not mechanically rugged, and require a large amount of power to operate.

SUMMARY

In general, the disclosure is directed to manufacturing a semiconductor device that can be used as a neutron detector. The semiconductor device is manufactured by forming a first wafer comprising an oxide layer, active semiconductor layer, and an interconnect layer on a substrate, forming a circuit transfer bond between the first wafer and a second wafer, removing the substrate, and depositing a bond pad, a barrier layer, and a neutron conversion layer on the oxide layer.

In one aspect, the disclosure is directed to a method of manufacturing a neutron detector, the method comprising forming a first wafer by at least forming an oxide layer on a substrate, forming an active semiconductor layer on the oxide layer, and forming an interconnect layer on the active semiconductor layer, forming at least one electrically conductive pathway extending from the interconnect layer through the active semiconductor layer and the oxide layer, forming a circuit transfer bond between the interconnect layer of the first wafer and a second wafer, removing the substrate of the first wafer after forming the circuit transfer bond, depositing a bond pad on the oxide layer of the first wafer after removing the substrate of the first wafer, wherein the bond pad is electrically connected to the electrically conductive pathway, depositing a barrier layer on the oxide layer of the first wafer after removing the substrate of the first wafer, and depositing a neutron conversion layer on the barrier layer after depositing the barrier layer.

In another aspect, the disclosure is directed to a semiconductor device comprising a first wafer comprising a substrate, an oxide layer on the substrate, an active semiconductor layer on the oxide layer, and an interconnect layer on the active semiconductor layer, wherein the active semiconductor layer comprises an array of charge-sensitive circuits configured to detect a secondary charged particle; a second wafer comprising a substrate and a contact layer on the substrate; and a circuit transfer bond formed between the contact layer of the first wafer and the contact layer of the second wafer.

The details of one or more examples of the disclosure are set forth in the accompanying drawings and the description below. Other features, objects, and advantages of the disclosure will be apparent from the description and drawings, and from the claims.

DETAILED DESCRIPTION

Figure 1:
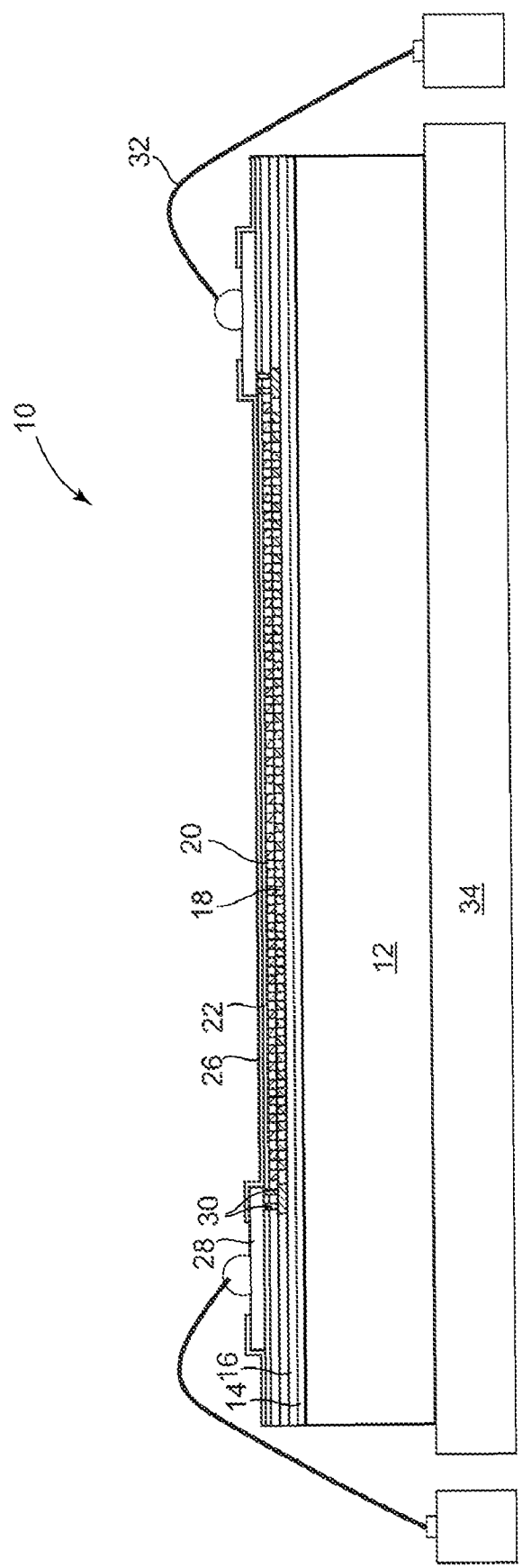
FIG. 1 is a schematic side-view diagram of an example neutron detector.

In general, this disclosure is directed to a method of making a semiconductor device that may be used as a solid-state neutron detector. The solid-state neutron detector made by the methods described in this disclosure provide an indication of the presence of neutrons through the use of an active semiconductor layer that detects ionizing radiation, such as the secondary charged particles produced through neutron nuclear reactions. The solid-state neutron detector includes a solid film of neutron conversion material, such as boron-10, that forms secondary charged particles, such as alpha particles, when a neutron encounters the neutron conversion material. In examples described herein, the neutron conversion material is placed in close proximity to a semiconductor device layer, also referred to as an active semiconductor layer, comprising an array of charge-sensitive circuits (e.g., one or more memory circuit arrays) that is sensitive to the secondary charged particles, and detection of changes in the semiconductor device layer indicates the presence of neutrons. The secondary charged particles can cause electrical effects in electrical elements that are present in the semiconductor device layer, and the electrical effects may be detected to detect the presence of neutrons. Solid-state neutron detectors can take advantage of the featured size, cost, voltage, and power scaling of mass manufactured silicon microelectronics, and, therefore, may be less expensive compared to neutron detectors that use gas-filled tubes containing neutron-sensitive material.

In neutron detectors described herein, the secondary charged particles generated in a neutron conversion layer, such as those from a Boron-10 isotope film, may have random, isotropic trajectories and a limited penetration range in solids such as silicon or silicon dioxide. For at least this reason, the neutron conversion layer may be positioned as close to the active semiconductor layer as is practically possible so that a sufficient number of secondary charged particles can reach the active semiconductor layer to generate a detectable change. In some examples in which the active semiconductor layer is deposited on the front side of a thin oxide layer, a neutron conversion layer is deposited on the back side (e.g., on an opposite side as the front side) of the thin oxide layer so that secondary charge particles must only pass through the thin oxide layer and any thin barrier layers or adhesive layers that may be included to reach the active semiconductor layer. This configuration may allow for a substantial fraction of the secondary charged particles generated in the neutron conversion layer to have a sufficient ion track in the active semiconductor layer. In this way, the neutron detector provides for detection of secondary charged particles produced by the reaction of neutrons with the neutron conversion layer.

An example method of making a solid-state neutron detector described herein comprises a wafer-to-wafer transfer step wherein the active semiconductor layer, associated interconnections, and the thin oxide layer on a first wafer substrate are bonded and transferred to a second, handle wafer substrate, followed by removal of the first wafer substrate. The wafer-to-wafer transfer comprises the formation of a permanent circuit transfer bond between the semiconductor device and the handle substrate in order to allow for subsequent semiconductor processing through standard complementary metal-oxide-semiconductor ("CMOS") techniques. The method also allows the neutron conversion material to be deposited as one of the last step or even the last step in the process at the wafer level so that it can be deposited outside of the standard semiconductor fabrication plant.

Depositing the neutron conversion material later (e.g., as a last step or nearly the last step) in the neutron detector formation process may be advantageous because the materials of the neutron conversion layer may have adverse effects on the fabrication process, such as the equipment used to form the active semiconductor layer and the interconnect layer, and generally are handled with special deposition procedures. Depositing the neutron conversion material after the formation of the remainder of the solid-state neutron detector may allow semiconductor fabrication plants to use stock manufacturing techniques at the die and assembly level, while the neutron conversion layer can be deposited at the wafer level, which may provide a cheaper and reliable manufacturing process compared to some prior methods of neutron conversion material deposition that required significant and expensive process developments and changes at either the die level or assembly level, or both.

FIG. 1 shows an example semiconductor device 10, also referred to as neutron detector 10, comprising a substrate 12, contact layers 14, 16 overlying substrate 12, at least one interconnect layer 18 overlying contact layers 14, 16, active semiconductor layer 20 overlying interconnect layer 18, an insulator layer, such as an oxide layer 22 (also referred to as a buried oxide or BOX layer 22) overlying active semiconductor layer 20, and a neutron conversion layer 24 overlying BOX layer 22. In some examples, neutron detector 10 may also include barrier layer 26 between BOX layer 22 and neutron conversion layer 24 to help prevent contamination of active semiconductor layer 20 and/or interconnect layer 18 by the neutron conversion material of neutron conversion layer 24. Barrier layer 26 may also help promote adhesion between neutron conversion layer 24 and BOX layer 22. Examples of materials that may be used as barrier layer 26 include, but are not limited to, silicon nitride or an oxynitride stack. An adhesion layer (not shown) may also be provided to adhere neutron conversion layer 24 to BOX layer 22 or barrier layer 26. In some examples, a passivation layer may also be deposited between BOX layer 22 and neutron conversion layer 24.

In the example shown in FIG. 1, neutron detector 10 also comprises bond pads 28 that electrically connect active semiconductor layer 20 to circuitry external to neutron detector 10, such as a printed board (not shown), through interconnect layer 18. In one example, at least one electrical conductive pathway, such as a via 30, is formed that extends from interconnect layer 18 though active semiconductor layer 20 and BOX layer 22 to electrically connect interconnect 18 to bond pad 28. In some examples, bond pads 28 may be electrically connected to the external circuitry via wire bonding with wires 32 that are bonded to bond pads 28 to the outside circuitry. However, any other suitable electrical connection between bond pads 28 and the external circuitry, such as flip chip solder bumps, may be implemented. In the example of FIG. 1, neutron detector 10 is shown to be mounted on a package lead frame 34 of an electrical package that provides a frame for the external circuitry. Bond pad 28 is wire bonded to the package with wires 32 in order to provide an electrical connection to the external circuitry.

Figure 2:
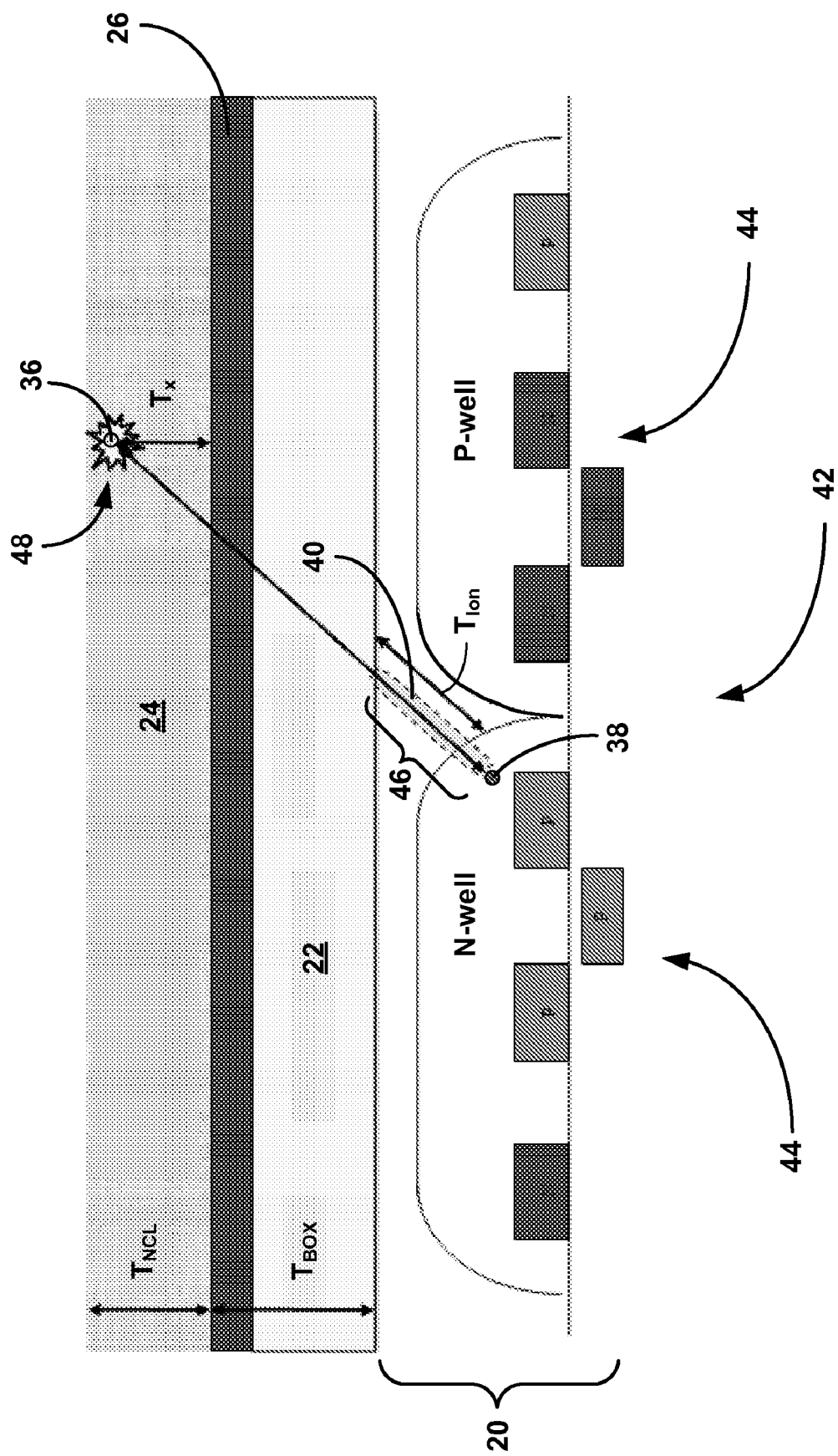
FIG. 2 is a schematic side-view diagram of the neutron detector of FIG. 1 and illustrates a nuclear reaction in a neutron conversion layer and the resulting secondary charged particle detected in an active semiconductor layer.

FIG. 2 is a conceptual illustration of a neutron interacting with neutron detector 10. Neutron detector 10 detects neutrons with the aid of neutron conversion layer 24, which comprises a neutron conversion material that reacts with neutrons 36 to emit secondary charged particles 38 from nuclear reaction site 48. Secondary charged particles 38 pass through neutron conversion layer 24 and oxide layer 22 to penetrate into active semiconductor layer 20 where the secondary charged particles 38 create a charge cloud 40 that can be detected by active semiconductor layer 20. In one example, neutron conversion layer 24 comprises a pure boron-10 film deposited by magnetron sputtering and standard chemical vapor deposition techniques. The boron-10 reacts with one or more neutrons 36 to emit alpha particles and lithium-7 ions ($^7$Li). The alpha particles and lithium-7 ions are both examples of secondary charged particles 38 that are capable of forming charge cloud 40 in active semiconductor layer 20. Other materials that may be used in neutron conversion layer 24 include, but are not limited to, compositions enriched with boron-10, such as a layer doped with boron-10 or a borophosphosilicate glass (BPSG) comprising boron-10, or a lithium-rich material.

After secondary charged particles 38 are formed, such as through the reaction of neutrons 36 with a boron-10 neutron conversion layer 24 to form alpha particles and lithium-7 ions, secondary charged particles 38 are emitted from neutron conversion layer 24 through BOX layer 22, and, if present in neutron detector 10, barrier layer 26 and any passivation layer, into active semiconductor layer 20. Active semiconductor layer 20 is configured to detect charge cloud 40 formed by secondary charged particles 38. In one example, active semiconductor layer 20 comprises an array 42 of charge-sensitive circuits 44, such as those in a static random access memory (SRAM) device that is susceptible to single-event upsets (SEUs). Secondary charged particles 38 that are emitted generally in the direction of active semiconductor layer 20 must pass through a portion of neutron conversion layer 24, barrier layer 26 (if present), and BOX layer 22 before at least one secondary charged particle 38 reaches active semiconductor layer 20. Secondary charged particles 38 emitted into active semiconductor layer 20 generate charge cloud 40 along ion tracks 46 that secondary charged particles 38 travel within active semiconductor layer 20.

Charge-sensitive array 42 detects the presence of the at least one secondary charged particle 38 if ion track 46 of secondary charged particle 38 has at least a minimum track length $T_{Ion}$ that produces sufficient charge to be detected by charge-sensitive array 42 (hereinafter referred to as a "detectable charge"). This minimum ion track length $T_{Ion}$ will depend on the sensitivity of the particular circuits 44 in charge-sensitive array 42. In one example, charge-sensitive array 42 has a sensitivity such that the minimum track length $T_{Ion}$ in active semiconductor layer 20 that will create a detectable charge is between about 0.2 microns and about 1.5 microns, such as between about 0.4 microns and about 0.9 microns, for example about 0.7 microns.

Each of the secondary charged particles 38 emitted from neutron conversion layer 24 has a limited amount of energy, and, thus, has a limited penetration range R through device 10. The actual penetration range R of a secondary charged particle 38 emitted from neutron conversion layer 24 may depend on the reaction that generates the secondary charged particle 38 and the materials through which the secondary charged particle 38 passes. For example, an alpha particle emitted from a reaction between a neutron 36 and boron-10 and that is emitted through silicon dioxide (which can be used as a dielectric material in BOX layer 22) and silicon (which can be used as a semiconductor material in active semiconductor layer 20) has been shown to have a penetration range of about 3.5 microns. Because of this limited penetration range R, positioning neutron conversion layer 24 as close to active semiconductor layer 20 as is practically possible can help improve the detection of neutrons 36 by neutron detector 10 because secondary charged particles 38 will have less distance to penetrate before reaching active semiconductor layer 20.

In one example, wherein BOX layer 22 and any barrier layers or adhesion layers has a thickness of about 2.5 microns, then less than about 5% of generated secondary charged particles 38 may have a detectable ion track length in silicon. However, in another example, wherein the thickness of BOX layer 22 and any barrier layers or adhesion layers is decreased to about 0.25 microns, then as much as about 35% of generated secondary charged particles 38 may penetrate into active semiconductor layer 20 with a detectable ion track. In the example shown in FIG. 2, the distance between neutron conversion layer 24 and active semiconductor layer 20 is equal to the thickness of BOX layer 22 and barrier layer 26 (if present), denoted as $T_{Box}$.

The fraction of generated secondary charged particles 38 that will reach active semiconductor layer 20 and penetrate into active semiconductor layer 20 with at least the desired minimum ion track length $T_{Ion}$ sufficient to generate a detectable charge can be estimated. Equation 1 below provides one formula for estimating the fraction of generated secondary charged particles 38 that reach active semiconductor layer 20 from the reactions of neutrons at a particular point within neutron conversion layer 24. Equation 1 assumes that secondary charged particles 38 are emitted uniformly from a point of reaction 48 within neutron conversion layer 24. In addition, Equation 1 assumes that only the half of generated secondary charged particles 38 that are emitted in the general direction of active semiconductor layer 20 reach active semiconductor layer 20. While the second assumption eliminates 50% of the generated secondary charged particles 38 from consideration, it is expected that, at least in the case of a single generally planar neutron conversion layer 24 situated generally parallel to a generally planar active semiconductor layer 20, approximately half of the generated secondary charged particles 38, e.g. those emitted in the direction away from active semiconductor layer 20, will fail to be captured by active semiconductor layer 20 regardless of how close neutron conversion layer 24 is from active semiconductor layer 20.

For a neutron conversion reaction that occurs at reaction point 48 at a depth $T_x$ from the bottom of neutron conversion layer 24 (i.e., the "bottom" referring to a surface of neutron conversion layer 24 closest to BOX layer 22), the fraction $F_{Tx}$ of secondary charged particles 38 that will have sufficient energy to penetrate active semiconductor layer 20 at least to the desired ion track length $T_{Ion}$ through BOX layer 22 and barrier layer 26 having a thickness $T_{Box}$ is determined based on Equation 1.

$$F_{T_x} = \frac{1}{\frac{\pi}{2}} \cos^{-1}\left(\frac{T_{Box} + T_x}{R - T_{Ion}}\right) \qquad [1]$$

In order to estimate the overall fraction of captured secondary charged particles 38 for all possible neutron reactions within neutron conversion layer 24, wherein neutron conversion layer 24 has a total thickness of $T_{NCL}$, Equation 1 is integrated throughout the entire thickness of neutron conversion layer 24, as shown in Equation 2.

$$F = \frac{2}{\pi T_{NCL}} \int_0^{T_{NCL}} \cos^{-1}\left(\frac{T_{Box} + T_x}{R - T_{Ion}}\right) dT_x \qquad [2]$$

The fraction F determined by Equations 1 and 2 only indicate the fraction of secondary charged particles 38 that are capable of reaching active semiconductor layer 20 with sufficient energy to penetrate to the desired minimum track length $T_{Ion}$.

As demonstrated by Equations 1 and 2, the primary factors that may affect whether a secondary charged particle 38 will have sufficient energy to penetrate to the minimum ion track length $T_{Ion}$ are the penetration range R of a secondary charged particle 38 in the materials of active semiconductor layer 20, BOX layer 22, and barrier layer 26 and the thickness $T_{Box}$ of BOX layer 22 and barrier layer 26, and of the position of nuclear reaction 48 within neutron conversion layer 24 ($T_x$). As can be seen by Equations 1 and 2, the fraction of detectable secondary charged particles 38 increases as the thickness of BOX layer 22 and barrier layer 26 decreases, as well as the thickness of any other intermediate layers between neutron conversion layer 24 and active semiconductor layer 20 (such as passivation layers or adhesion layers), such that more secondary charged particles with a sufficient ion track length $T_{Ion}$ will reach active semiconductor layer 20. In one example, the aggregate thickness $T_{Box}$ of BOX layer 22 and barrier layer 26 (as well as any passivation layers, adhesion layers, or other layers that may be present) is between about 0.1 micron and about 1 microns, for example between about 0.15 microns and about 0.5 microns, such as about 0.25 microns.

Practical considerations that may limit the desirable minimum thickness of BOX layer 22 without adversely affecting the functionality of BOX layer 22 include the amount of electrical isolation provided by BOX layer 22, which may be selected to electrically isolate active semiconductor layer 20 from bond pad 28 and barrier layer 26 (except though electrically conductive pathways such as vias 30), mechanical integrity of bond pad 28 (e.g., to withstand the formation of wire bonding with wires 32), and the prevention of capacitance being added to the charge-sensitive circuits 44 of active semiconductor layer 20, making it difficult for charge-sensitive array 42 to detect relatively small changes deposited by secondary charged particles 38. Adverse affects of limiting BOX layer 22 to a thickness below the desirable minimum thickness of BOX layer 22 can include, for example, degradation in the electrical isolation between active semiconductor layer 22 and bond pad 28 and barrier layer 26.

Practical considerations that may limit the desirable minimum thickness of barrier layer 26 without adversely affecting the functionality of barrier layer 26 may include the amount of contamination protection provided by barrier layer 26, which can be selected to prevent contamination of active semiconductor layer 20 and interconnect layer 18 by the neutron conversion material of neutron conversion layer 24 or by other mobile ionic contamination, such as $Na^+$ ions, deposition uniformity and step coverage of barrier layer 26. Adverse affects of limiting a thickness of barrier layer 26 to a thickness below the desirable minimum thickness may include, for example, contamination of active semiconductor layer 20 by neutron conversion material of neutron conversion layer 24. In one example, BOX layer 22 has a thickness of between about 0.05 microns and about 1.5 microns, such as between about 0.15 microns and about 0.5 micron, for example about 0.25 microns. In one example, barrier layer 26 has a thickness between about 0.05 microns and about 1.5 microns, such as between about 0.05 microns and about 0.25 microns, for example about 0.1 microns.

A portion of an example active semiconductor layer 20 usable in the neutron detector 10 of the present disclosure is shown in FIG. 2 and includes an array 42 of charge-sensitive circuits 44 fabricated in active semiconductor layer 20 that are capable of detecting a charge cloud 40 created by a secondary charged particle 38. In one example, active semiconductor layer 20 exploits the phenomenon of single event upsets (SEUs), which results from radiation-induced bit errors in semiconductor memory devices caused by the presence of ionizing radiation. These SEUs can be used to detect the presence of ionizing radiation, such as the secondary charged particles produced through neutron nuclear reactions 48, by using the semiconductor device to determine when SEUs have occurred. The solid-state neutron detector 10 described herein may take advantage of the SEU phenomenon through the use of solid films made from neutron converter materials, such as $^{10}B$ that form secondary charged particles, such as alpha particles.

In some examples, charge-sensitive circuits 44 may comprise p-channel and re-channel metal-oxide-semiconductor field-effect transistors (MOSFETs), such as resistors, capacitors, diodes, and bipolar junction transistors (BJTs). In some examples, charge-sensitive circuits 44 may be configured similar to a conventional semiconductor memory device, such as a static random access memory (SRAM) device with individual memory cells. In one example, charge-sensitive circuits 44 may be configured to detect and count secondary charged particles as they "hit" (e.g., interact with or come into contact with) charge-sensitive array 42. Example types of circuits that may be used to count these hits include, but are not limited to, state latching circuits, glitch generating circuits, and/or charge loss circuits. State latching circuits are single event upset based and store the binary state change for later readout. State latching circuits may be a one-state memory cell lacking a second bitline and a second enable select transistor. These circuits allow for very infrequent reads as well as a spatial mapping of the upsets. Glitch generating circuits, or edge producing cells, create a "glitch," e.g., a rising or falling edge for each upset detected. Charge-loss circuits create charge leakage on a node in response to a secondary charged particle intrusion. The observable circuit change can be cell current, threshold voltage, change in voltage on the bit-line during a read, or a floating body effect. A charge-loss circuit may be constructed as an array of partially-depleted floating-body SOI transistors with drains coupled to bit lines and sources coupled to a low voltage.

In other examples, charge-sensitive circuits 44 may also comprise other charge-sensitive devices such as dynamic random access memory (DRAM), other types of random access memories, non-random access memories, charge coupled devices, charge injection devices, or other memory devices structures and substrates. Examples of charge-sensitive circuits 44 and arrays 42 that may be used with neutron detector 10 of the present disclosure are disclosed in commonly-assigned U.S. patent application Ser. No. 12/536,950, which is entitled, "Neutron Detector Cell Efficiency," and was filed on Aug. 6, 2009, the disclosure of which is incorporated herein by reference in its entirety.

In one example, active semiconductor layer 20 comprises a layer of a semiconductor material, such as silicon, and circuits 44 of charge-sensitive array 42 can be fabricated in the semiconductor material. In one example, circuits 44 are fabricated by doping, e.g., by diffusing impurities into select portions of the semiconductor material in order to form areas with higher levels of free electrons, indicated by an N for "negative" in FIG. 2, or higher levels of holes, indicated by a P for "positive" in FIG. 2. In some examples, the semiconductor material of active semiconductor layer 20 may comprise silicon. In other examples, active semiconductor layer 20 may comprise other semiconductor materials, such as, but not limited to, silicon carbide (SiC), germanium (Ge), silicon germanium (SiGe), gallium arsenide (GaAs), diamond, or any other appropriate semiconductor materials.

Returning to FIG. 1, the at least one interconnect layer 18 includes conductive contacts and vias that electrically connect electrical elements of charge-sensitive array 42 of active semiconductor layer 20 to each other and to external circuitry, such as a printed board (not shown) connected to neutron detector 10. Interconnect layer 18 is not illustrated in detail in FIG. 1. Interconnect layer 18, sometimes referred to as a metal layer, can include electrically conductive paths, formed, e.g., by wiring, traces, and/or electrically conductive vias, surrounded by a dielectric material, such as silicon dioxide or a low-κ dielectric. The electrically conductive paths provide unrestricted routing layers among charge-sensitive array 42 and between array 42 and circuitry external to neutron detector 10. In one example, neutron detector 10 comprises a stack of a plurality of interconnect layers 18, such as two interconnect layers (not shown) deposited on active semiconductor layer 20, e.g., with a first interconnect layer deposited directly adjacent to active semiconductor layer and a second interconnect layer deposited directly adjacent the first interconnect layer.

Electrically conductive pathways, such as vias 30, provide an electrical connection between interconnect layer 18 and bond pad 28. In one example, vias 30 comprise an electrical conductive material, such as tungsten or copper. In another example, the electrically conductive pathway between bond pad 28 and interconnect layer 18 comprises a doped semiconductor material, such as doped silicon, capable of electrical conduction between bond pad and interconnect layer 18. In one example, at least two vias 30 are provided for each bond pad 28, although each bond pad 28 can be electrically coupled to any suitable number of electrically conductive pathways in other examples.

Bond pads 28 electrically connect interconnect layer 18 to external circuitry, such as a printed board, though vias 30. In the example shown in FIG. 1, bond pads 28 are located on BOX layer 22 (e.g., directly adjacent BOX layer 22) on a side opposite active semiconductor layer 20. In one example, bond pads 28 provide an area that is sufficiently large to allow electrical connection between interconnect layer 18 and external circuitry (e.g., a power supply, ground, signal sources, other chips, printed boards, and the like). Bond pads 28 can be formed from any suitable electrically conductive material, such as, for example, aluminum, gold, or an aluminum alloy, such as AlCu.

Figure 3:
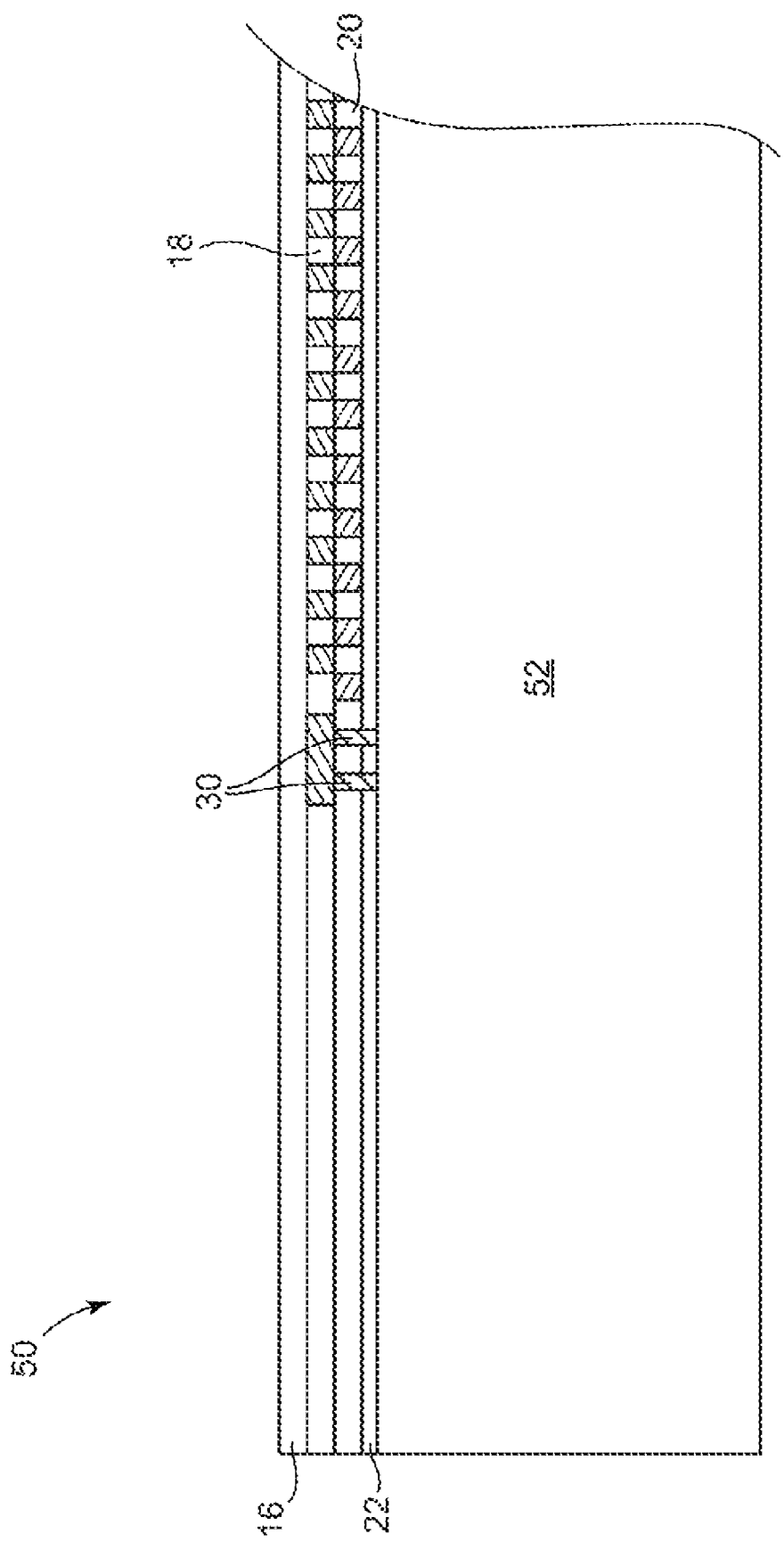
FIG. 3 is a schematic side-view diagram of an example device wafer that may be used to manufacture a neutron detector.

FIGS. 3-9 illustrate example structures that are defined during an example method of making neutron detector 10. FIG. 3 illustrates an example device wafer 50 that includes structural components that will define the functional components of neutron detector 10. Device wafer 50 comprises a substrate 52, such as a bulk semiconductor substrate, with an insulator layer 22, such as a buried oxide (BOX) layer 22, deposited on a front side of substrate 52. An active semiconductor layer 20 is fabricated on a front side of BOX layer 22. Device wafer 50 also comprises at least one interconnect layer 18 deposited on a front side of active semiconductor layer 20. Device wafer 50 may also comprise a contact layer 16 deposited on a front side of interconnect layer 18.

As described below, many of the structures of device wafer 50 will become structures of the final neutron detector 10. For example, the insulator layer of device wafer 50 defines BOX layer 22 of neutron detector 10, the active semiconductor layer of device wafer 50 defines active semiconductor layer 20 of neutron detector 10, and the interconnect layer of device wafer 50 defines interconnect layer 18 of neutron detector 10. Therefore, the same reference numbers will be used throughout to describe these structures. In the example shown in FIG. 3, vias 30 are pre-formed as part of device wafer 50, e.g., vias 30 are formed during the fabrication of BOX layer 22, active semiconductor layer 20, and interconnect layer 18. As described below, vias may also be formed after subsequent processing of device wafer 50, such as after the removal of substrate 52. As shown in FIG. 3, vias 30 extend from interconnect layer 18, through active semiconductor layer 20 and through BOX layer 22.

Figure 4:
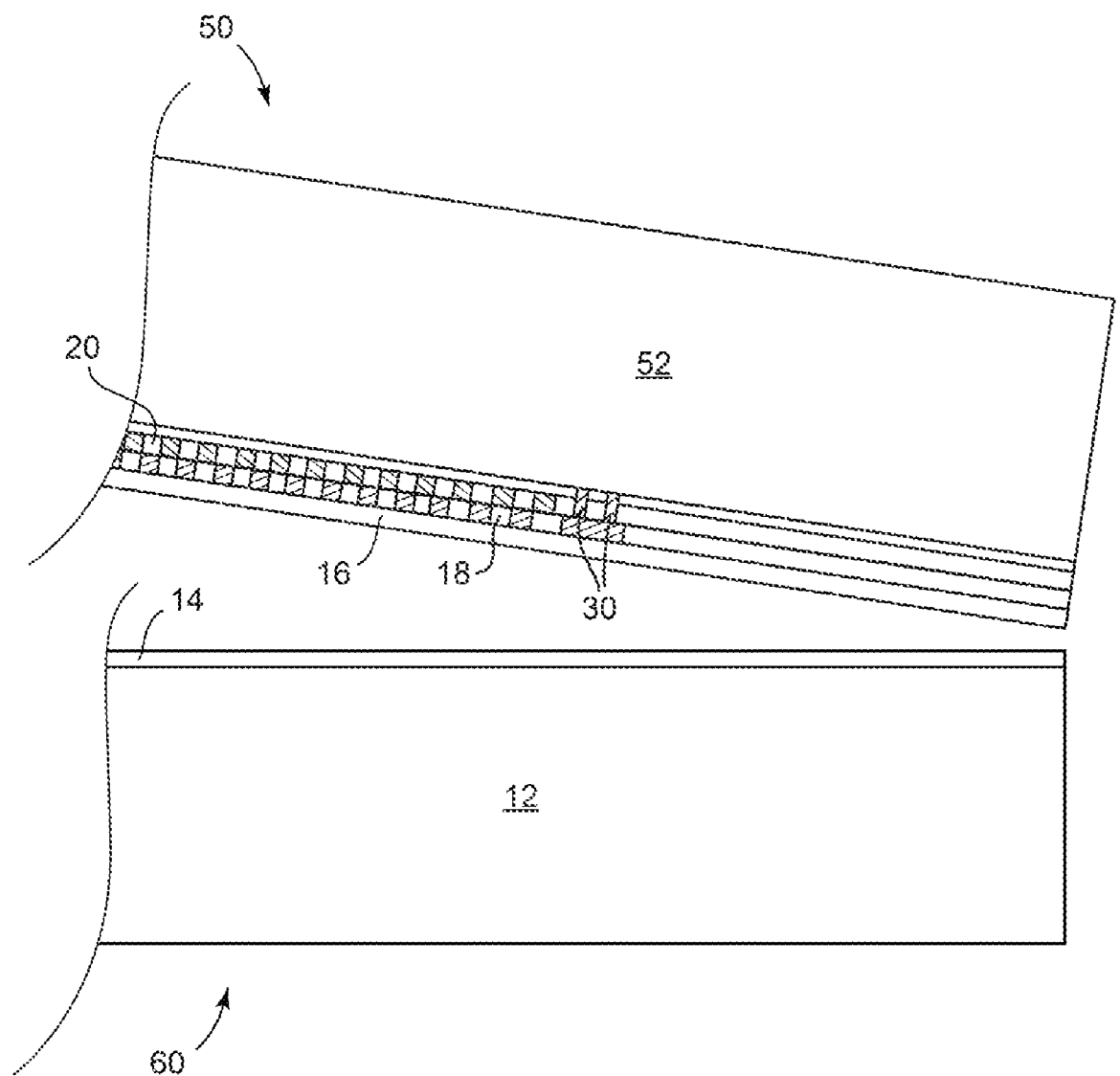
FIG. 4 is a schematic side-view diagram of the example device wafer of FIG. 3 at a subsequent stage of processing before the device wafer is bonded to a handle wafer.

FIG. 4 shows device wafer 50 at a subsequent stage of manufacturing from that shown in FIG. 3. In FIG. 4, device wafer 50 has been inverted and is being placed on a second, handle wafer 60 so that handle wafer 60 may be bonded to a front side of device wafer 50. Handle wafer 60 provides structural support to active semiconductor layer 20 and interconnect layer 18 when substrate 52 of device wafer 50 is removed. Handle wafer 60 may comprise a bulk substrate 12, which later defines substrate 12 of neutron detector 10 (FIG. 1), and a contact layer 14 deposited on substrate 12. Substrate 12 may comprise a semiconductor material, such as a bulk silicon, silicon oxide, silicon nitride, sapphire, germanium, SiGe, silicon carbide, sapphire, or metals. In one example, device wafer 50 and handle wafer 60 generally have the same dimensions and the side surfaces of device wafer 50 are aligned with the side surfaces of handle wafer 60 so that the resulted bonded wafer has generally the same dimensions as each wafer 50, 60, but with a greater thickness.

Device wafer 50 and handle wafer 60 may be aligned by ensuring that the outer edges of device wafer 50 and handle wafer 60 are aligned. Other methods of alignment may include the use of infrared vision to align the wafers, or the use of alignment tools that align each wafer 50, 60 to the tool so that the wafers 50, 60 are aligned with one another. Device wafer 50 is positioned so that contact layer 14 of handle wafer 60 is in contact with the front side of device wafer 50. In one example, shown in FIGS. 4 and 5, contact layer 14 is placed in contact with a front side of contact layer 16 of device wafer. In another example, contact layer 14 is placed in contact with a front side of interconnect layer 18.

Figure 5:
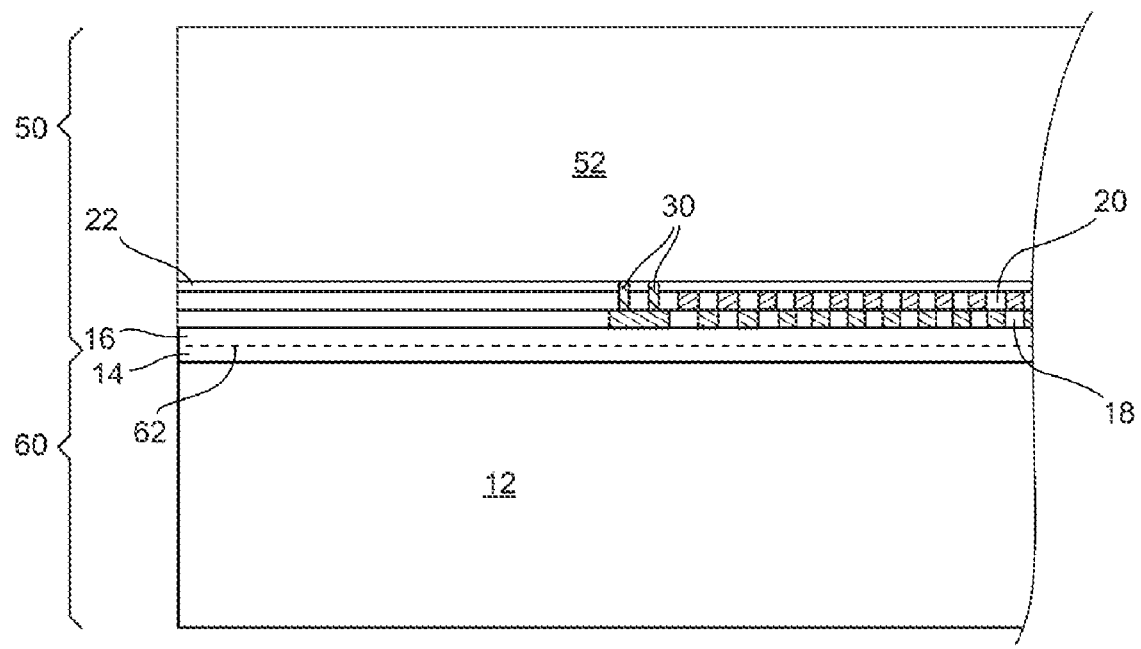
FIG. 5 is a schematic side-view diagram of the example structure of FIG. 4 at a subsequent stage of processing after the device wafer has been bonded to the handle wafer.

FIG. 5 shows a subsequent step in processing after the positioning of device wafer 50 on handle wafer 60, as described above with respect to FIG. 4. As shown in FIG. 5, device wafer 50 is bonded to handle wafer 60 with a wafer transfer bond 62, which is formed between the front side of device wafer 50 and handle wafer 60. In one example, wafer transfer bond 62, also referred to herein as a circuit transfer bond 62, is formed between contact layer 14 of handle wafer 60 and device wafer 50. In one example, device wafer 50 comprises a contact layer 16 deposited on the front side of interconnect layer 18 (e.g., opposite active semiconductor layer 20), wherein circuit transfer bond 62 is formed between the front side of contact layer 16 of device wafer 50 and contact layer 14 of handle wafer 60.

As described in more detail below, after circuit transfer bond 62 is formed, substrate 52 of device wafer 50 is removed and additional semiconductor processing steps are performed on the resulting wafer to manufacture neutron detector 10. Therefore, circuit transfer bond 62 is configured to provide a permanent bond that is sufficiently strong to provide mechanical structural support to active semiconductor layer 20 and interconnect layer 18 during the additional processing steps. In addition, circuit transfer bond 62 is configured to withstand the processing conditions that it will be subjected to during subsequent processing of the wafer. For example, circuit transfer bond 62 may be subjected to a large shear force as device wafer substrate 52 is removed if removal of substrate 52 is performed by grinding or chemical-mechanical planarization (CMP). Circuit transfer bond 62 may also be subjected to large mechanical forces during die singulation, such as using a die saw. In another example, circuit transfer bond 62 may be subjected to high temperatures due to the deposition of subsequent layers, such as bond pads 28, barrier layer 26, passivation or adhesive layers, and neutron conversion layer 24. In one example, circuit transfer bond 62 is formed at a relatively low temperature of between about 100° C. and about 400° C., so that the formation of circuit transfer bond 62 will not compromise the metallization that forms the interconnect portions of interconnect layer 18. Examples of circuit transfer bonds 62 that may be used to bond device wafer 50 to handle wafer 60 include an oxide-to-oxide bond and a metal-to-metal bond.

In one example, circuit transfer bond 62 comprises an oxide-to-oxide bond formed between two dielectric layers. In one example, device wafer 50 comprises a contact layer 16 comprising a dielectric material, such as silicon dioxide or TEOS, deposited on interconnect layer 18 and handle wafer 60 also comprises a contact layer 14 comprising a dielectric material, such as silicon dioxide or TEOS. In another example, an oxide-to-oxide bond is formed between contact layer 14 of handle wafer and the dielectric material that is part of interconnect layer 18 (e.g., the dielectric that isolates the electrically conductive paths within interconnect layer 18). An oxide-to-oxide bond may be formed by preparing the surfaces of contact layers 14, 16, such as by planarizing or polishing the surfaces, and pressing contact layer 14 and contact layer 16 together at an elevated temperature and/or pressure. An example of an oxide-to-oxide bond is the direct oxide bonding method used by S.O.I.TEC Silicon On Insulator Technologies ("Soitec") of Bernin, France. Other methods of bonding may be used, such as oxide fusion bonding, eutectic bonding, thermo-compression bonding, or silicon-on-glass ("SOG") bonding.

In another example, circuit transfer bond 62 comprises a metal-to-metal bond formed between two metal layers. In one example, handle wafer 60 may comprise a metal contact layer 14, such as a layer comprising copper. Metal contact layer 14 of handle wafer 60 is bonded to metal portions of device wafer 50. The metal portions of device wafer 50 that is bonded to metal contact layer 14 of handle wafer 60 may comprise a metal contact layer 16, such as a layer of copper, deposited on interconnect layer 18, or the metal of device wafer 50 may comprise portions of the metal interconnect that define interconnect layer 18 (e.g., the wiring, traces, or electrically conductive pathways, such as vias that provide interconnection between the electrical elements of charge-sensitive array 42 and between charge-sensitive array 42 and bond pads 28). In one example, to prevent undesired shorting within interconnect layer 18, a dielectric layer (not shown) may be deposited between interconnect layer 18 and a metal contact layer 16 of device wafer 50. A metal-to-metal bond may be formed by preparing the surfaces of metal contact layers 14, 16, such as by planarizing or polishing the surfaces, and pressing contact layer 14 and contact layer 16 together at an elevated temperature and/or pressure, sometimes referred to as a diffusion bond or diffusion weld. An example of a metal-to-metal bonding method is a thermo-compression bonding method provided by Tezzaron Semiconductor of Naperville, Ill.

Figure 6:
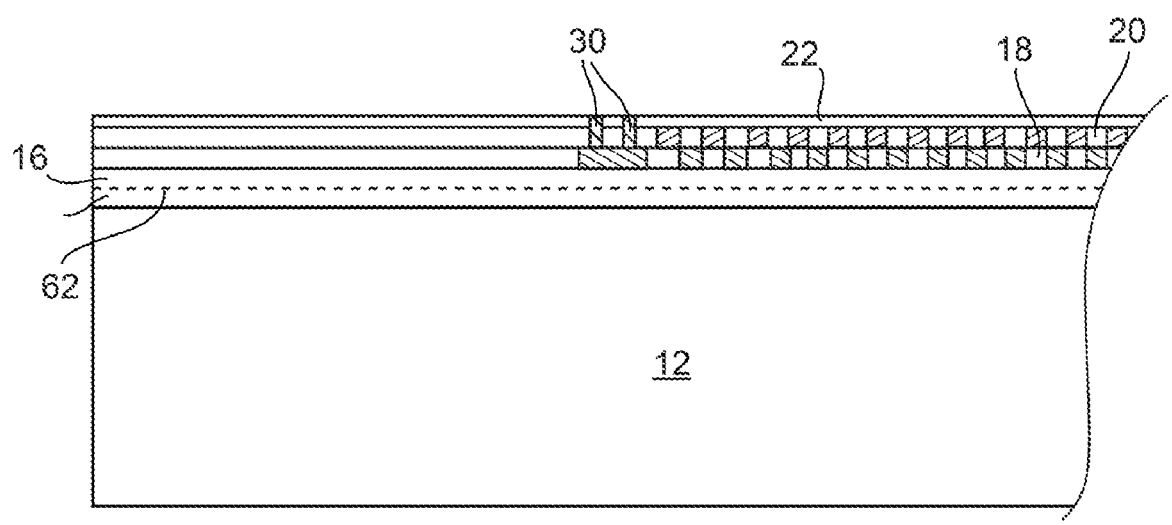
FIG. 6 is a schematic side-view diagram of the example structure of FIG. 5 at a subsequent stage of processing after removal of a substrate of the device wafer.

FIG. 6 shows a subsequent step in processing after the formation of circuit transfer bond 62 described above with respect to FIG. 5. In FIG. 6, substrate 52 of device wafer 50 has been removed from a back side of BOX layer 22. Circuit transfer bond 62 securely bonds handle wafer 60 to interconnect layer 18, active semiconductor layer 20, and BOX layer 22, such that substrate 12 of handle wafer 60 acts as the support substrate in place of substrate 52 of device wafer 50 that was removed. In one example, removal of substrate 52 is accomplished by at least one of grinding the material of substrate 52 away, polishing the material of substrate 52 away, such as through chemical-mechanical polishing ("CMP"), and chemically etching the material of substrate 52 away. Other methods of removing the material of substrate 52 may also be used. In one example, removal of substrate 52 of device wafer 50 may also comprise removal of a portion of BOX layer 22, such as by grinding, polishing, or etching away a portion of BOX layer 22 at the end of the process of removing substrate 52.

Figure 7:
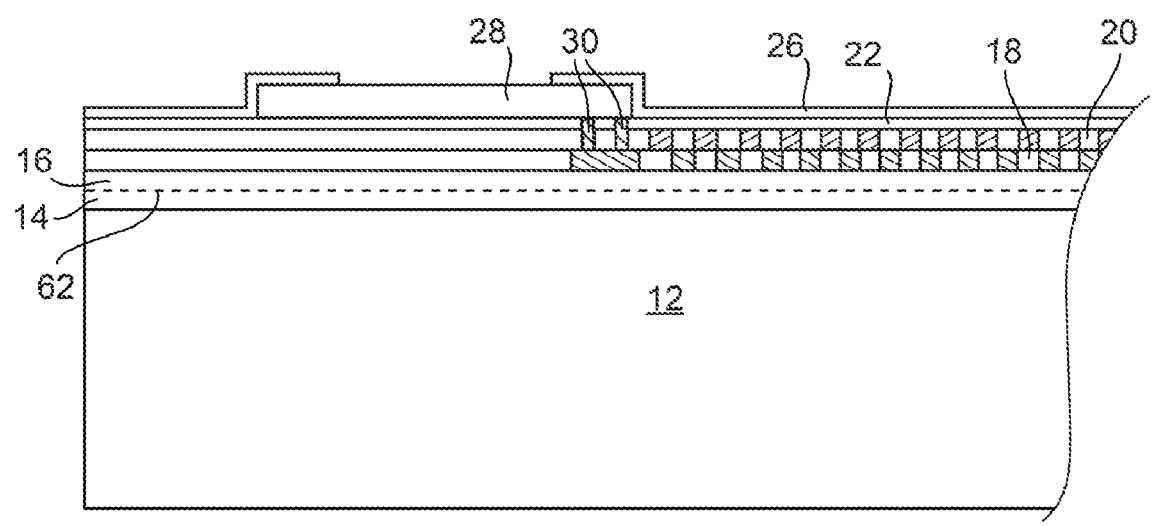
FIG. 7 is a schematic side-view diagram of the example structure of FIG. 6 at a subsequent stage of processing after depositing a bond pad and a barrier layer and patterning a bond pad opening.

FIG. 7 shows a subsequent step in processing after the removal of substrate 52 as described above with respect to FIG. 6. In FIG. 7, bond pad 28 has been deposited over the back side of BOX layer 22 so that bond pad is electrically connected to vias 30, and thus is electrically connected to interconnect layer 18. Barrier layer 26 is also deposited over the back side of BOX layer 22.

In the example shown in FIG. 7, bond pad 28 is deposited at a location on the back side of BOX layer 22 over vias 30, and barrier layer 26 is subsequently deposited to cover a portion of bond pad 28 and the remaining exposed portions of the back side of BOX layer 22. As described above, in one example, vias 30 are pre-formed in device wafer 50 before bonding device wafer 50 to handle wafer 60 so that vias 30 extend from interconnect layer 18 through active semiconductor layer 20 and BOX layer 22. In such a case, vias 30 are exposed when substrate 52 is removed from the back side of BOX layer 22. As a result, when bond pad 28 is deposited on the back side of BOX layer 22, the material that defines bond pad 28 may be deposited over the region of BOX layer 22 through which vias 30 extend, such that bond pad 28 is in electrical contact with vias 30. In one example, the material of bond pad 28 may be deposited and then patterned, such as by etching, so that the material only remains at the desired location of bond pad 28. In another example, the back side of BOX layer 22 may be masked with only the positions of bond pads 28 exposed, the material of bond pads 28 may then be deposited on the exposed portions, and the mask may be removed. In the example of FIG. 7, once bond pads 28 are formed, barrier layer 26 is deposited over BOX layer 22 and patterned. Other layers may be deposited onto BOX layer 22, such as a passivation layer or an adhesion layer, before barrier layer 26 is deposited over BOX layer 22. In one example, barrier layer 26 is deposited over the entirety of BOX layer 22 and bond pads 28, then barrier layer 26 is patterned, such as by masking and etching, to create openings through barrier layer 26 over bond pads 28.

Figure 8:
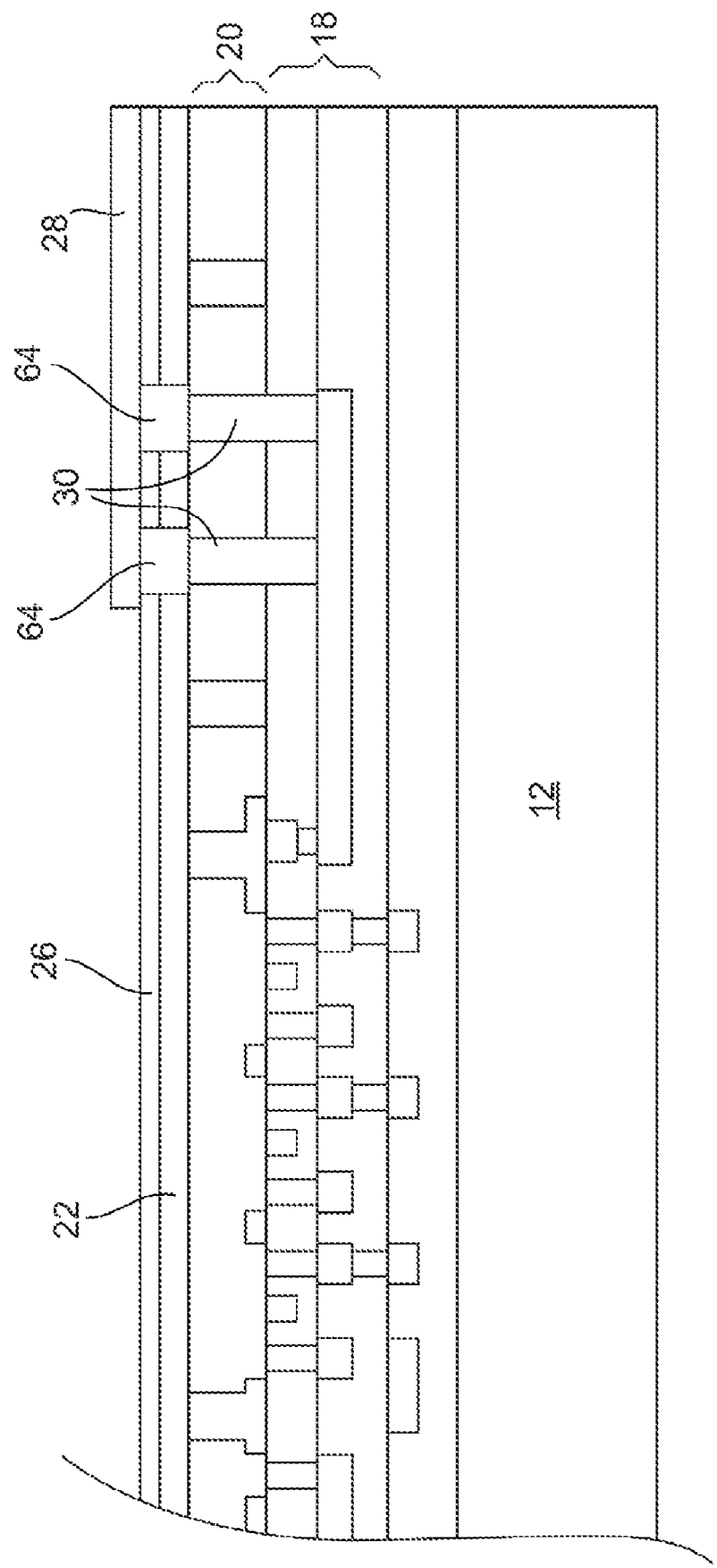
FIG. 8 is a schematic side-view diagram of the example structure of FIG. 6 at an alternate subsequent stage of processing after depositing a barrier layer and a contact pad.

In another example, shown in FIG. 8, barrier layer 26 is deposited over BOX layer 22 such that barrier layer 26 covers substantially all of BOX layer 22, including the exposed portion of vias 30. In a subsequent step, one or more openings are patterned in barrier layer 26, such as by masking and etching, in order to expose vias 30. At least one metallized contact 64, such as an AlCu or tungsten contact material, is deposited in the openings to provide an electrical contact through barrier layer 26 to vias 30. Bond pad 28 is then deposited and patterned on top of barrier layer 26 over metallized contacts 64 so that bond pad 28 is electrically connected to vias 30 through metallized contacts 64.

In yet another example, not shown in FIG. 8, bond pads 28 may not be deposited until after the deposition of neutron conversion layer 24 or barrier layer 26 alone. In such an example, neutron conversion layer 24 and barrier layer are patterned in order to expose vias 30 to provide the electrical connection between the bond pad and vias 30. Metallized contacts may also be formed to provide the electrical connection between the bond pad and vias 30. Neutron conversion layer 24, which may comprise an electrically conductive material, may also need to be electrically isolated from the bond pad, such as with a dielectric insulation layer between neutron conversion layer 24 and the bond pad (not shown).

Figure 9:
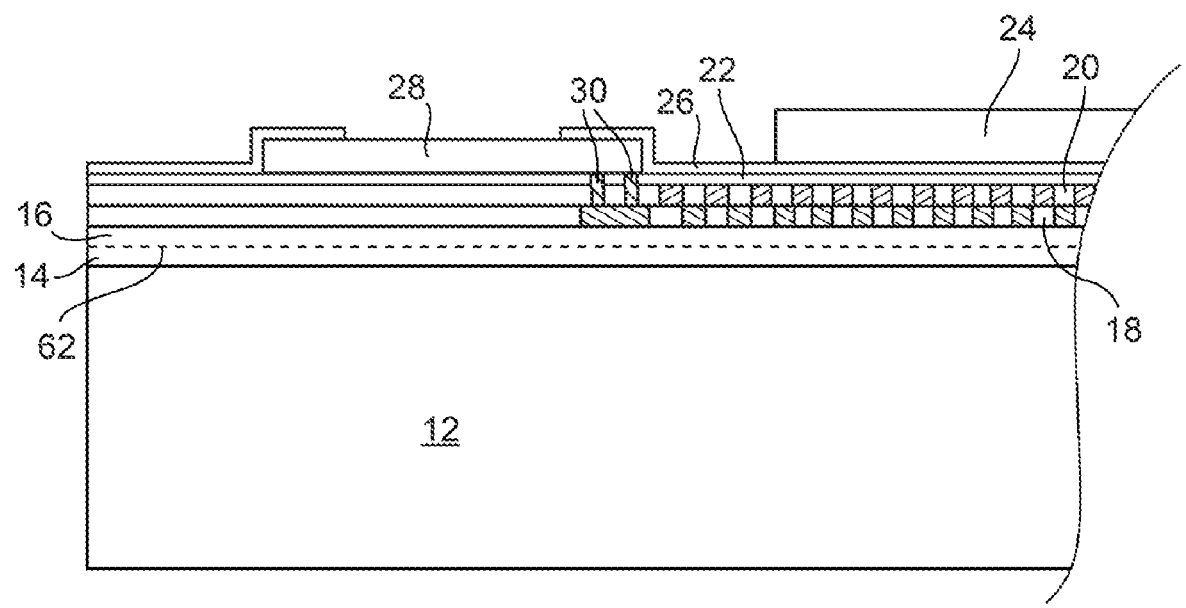
FIG. 9 is a schematic side-view diagram of the example structure of FIG. 7 at a subsequent stage of processing after depositing a neutron conversion layer.

FIG. 9 shows a subsequent step in processing after the deposition of bond pads 28 and barrier layer 26 as described above with respect to FIG. 7. Neutron conversion layer 24 has been deposited and patterned on barrier layer 26 over active semiconductor layer 20 so that secondary charged particles 38 (FIG. 2) emitted from the reaction of neutrons with neutron conversion layer 24 may be detected by charge-sensitive array 42. In one example, neutron conversion layer 24 is deposited by first forming a shadow mask (not shown) over barrier layer 26 and bond pad 28, where the shadow mask exposes the portions of barrier layer 26 where it is desired that neutron conversion layer 24 be deposited. The neutron conversion material of neutron conversion layer 24 is then deposited over the exposed portions of the shadow mask. Neutron conversion layer 24 can be deposited using any suitable technique capable of depositing the neutron conversion material selected for neutron conversion layer 24. For example, if a boron-10 neutron conversion material is selected, neutron conversion layer 20 may be deposited by magnetron sputtering or by chemical vapor deposition. After the neutron conversion material is deposited, the shadow mask is removed, leaving neutron conversion layer 24 behind. The neutron conversion material may be patterned by other methods, such as by conventional photo-lithography and etch techniques, such as reactive ion etching, in order to remove selective portions of the neutron conversion material, such as to expose bond pad 28.

As demonstrated by the example method described with respect to FIGS. 3-9, a technique for forming neutron detector 10 by forming circuit transfer bond 62 between device wafer 50 and handle wafer 60 and subsequently removing substrate 52 of device wafer 50 allows neutron conversion layer 24 to be deposited very close to active semiconductor layer 20 because neutron conversion layer 24 is only separated from active semiconductor layer 20 by the relatively thin barrier layer 26 and BOX layer 22. The example method described above with respect to FIGS. 3-9 also allows neutron conversion layer 24 to be the last layer or one of the last layers deposited during the manufacture of neutron detector 10. This is advantageous because the neutron conversion material used to make neutron conversion layer 24 can contaminate semiconductor device manufacturing equipment used to fabricate neutron detector, particularly front-end processing equipment used to make active semiconductor layer 20, such as diffusion furnaces and wet chemical operations.

Some semiconductor fabrication plants prefer not to deposit neutron conversion materials, or any other non-standard materials, or to work with any components that have had a prior neutron conversion material deposition because of the risk to their equipment. The example methods described above with respect to FIGS. 3-9 allows neutron conversion layer 24 to be deposited after completion of semiconductor processing at a fabrication plant and in a separate manufacturing environment from the fabrication plant. This may be advantageous because some fabrication plants prefer no changes or additions to the processing that are not standard, CMOS processes. Any non-standard, CMOS-based process, such as the processes necessary for the deposition of neutron conversion materials, requires additional engineering control and removes the processing from the learning, statistical process control, and yield/reliability improvements that have come about from standard CMOS processing, adding cost and risk to the manufacturing process.

Figure 10:
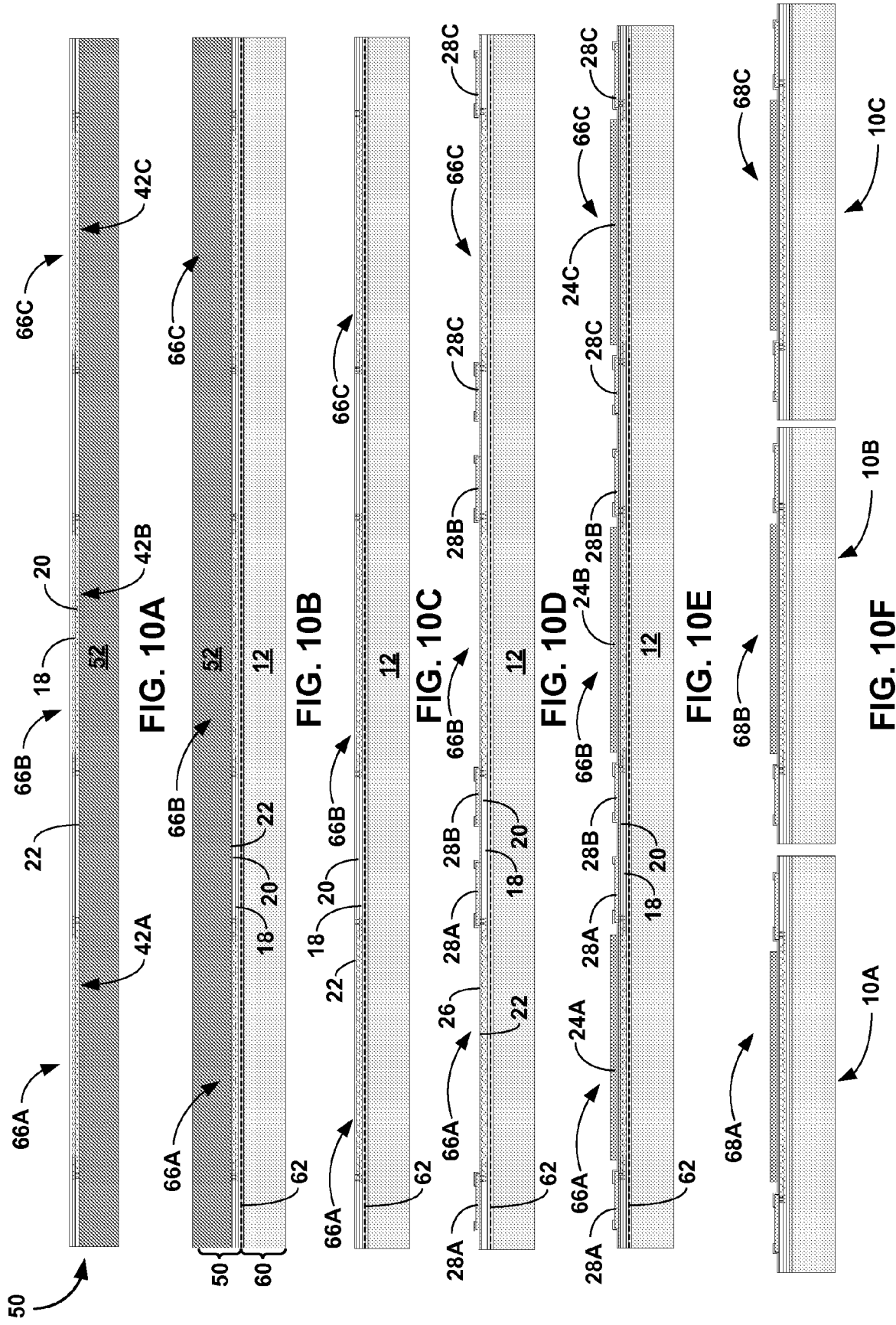
FIGS. 10A-10F are schematic side-view diagrams of the processing of a wafer comprising a plurality of neutron detection dice.

FIGS. 3-9 focus on a portion of device wafer 50 and handle wafer 60 that form a single neutron detector 10. In other words, FIGS. 3-9 focus on individual dice of device wafer 50 and handle wafer 60. In some examples, however, a plurality of neutron detectors is formed from a single device wafer 50. FIGS. 10A-10F illustrate an example in which device wafer 50 comprises a plurality of dice 66A, 66B, 66C, wherein each die 66A, 66B, 66C may form an individual neutron detector 10A, 10B, 10C. FIGS. 10A-10F shows the steps of FIGS. 3-9 being performed on the entire wafer. For example, in FIG. 10A, when device wafer 50 is formed (as in FIG. 3 described above), active semiconductor layer 20 comprises a plurality of charge-sensitive arrays 42A, 42B, 42C, wherein each charge-sensitive array 42A, 42B, 42C corresponds to a respective die 66A, 66B, 66C that will each form a separate neutron detector 10A, 10B, 10C (FIG. 10F). In FIG. 10B, device wafer 50 has been bonded to handle wafer 60 with circuit transfer bond 62 formed between them, as described with respect to FIG. 5. In FIG. 10C, substrate 52 of device wafer 50 has been removed down to BOX layer 22, as described with respect to FIG. 6. In FIG. 10D, barrier layer 26 has been deposited and bond pads 28A, 28B, 28C have been formed for each die 66A, 66B, 66C, as described with respect to neutron detector 10 and FIG. 7. In FIG. 10E, a neutron conversion layer 24A, 24B, 24C has been deposited and patterned for each die 66A, 66B, 66C, as in FIG. 9 described above.

Once each die 66A, 66B, 66C has been formed so that each die 66A, 66B, 66C has all of the components needed to be a functional neutron detector 10A, 10B, 10C, respectively, the wafer shown in FIG. 10E is singulated into individual dice 68A, 68B, 68C to form separated neutron detectors 10A, 10B, 10C. Singulation, also referred to as dicing or wafer dicing, may be accomplished using any suitable technique, such as through the formation of scribe lines in substrate 12 and/or other layers of the wafer and breaking the wafer along the scribe lines, or cutting the wafer into individual dice, such as with a mechanical wafer saw or by laser cutting. FIG. 10F shows individual neutron detectors 10A, 10B, 10C after dicing the wafer.

As described above, in the example shown in FIG. 3, the electrically conductive pathways, such as vias 30, are "preformed" in device wafer 50, e.g., vias 30 are formed during fabrication of BOX layer 22, active semiconductor layer 20, and interconnect layer 18 before bonding device wafer 50 to handle wafer 60 and removing substrate. In other examples, vias 30 may be formed by other methods and at other times. In one example, vias 30 are not formed until after device wafer 50 has been bonded to handle wafer 60 and substrate 52 of device wafer 50 has been removed. In such an example, after substrate 52 has been removed, one or more openings may be patterned to extend through BOX layer 22 and active semiconductor layer 20 and into interconnect layer 18. An electrically conductive material, such as tungsten, can then be deposited into the opening to form vias 30. An electrical insulation material, for example a dielectric such as silicon dioxide or a tetraethyl orthosilicate oxide ("TEOS oxide"), may be deposited or grown in the openings before the via material is deposited in order to electrically isolate vias 30 from components of active semiconductor layer 20.

Figure 11:
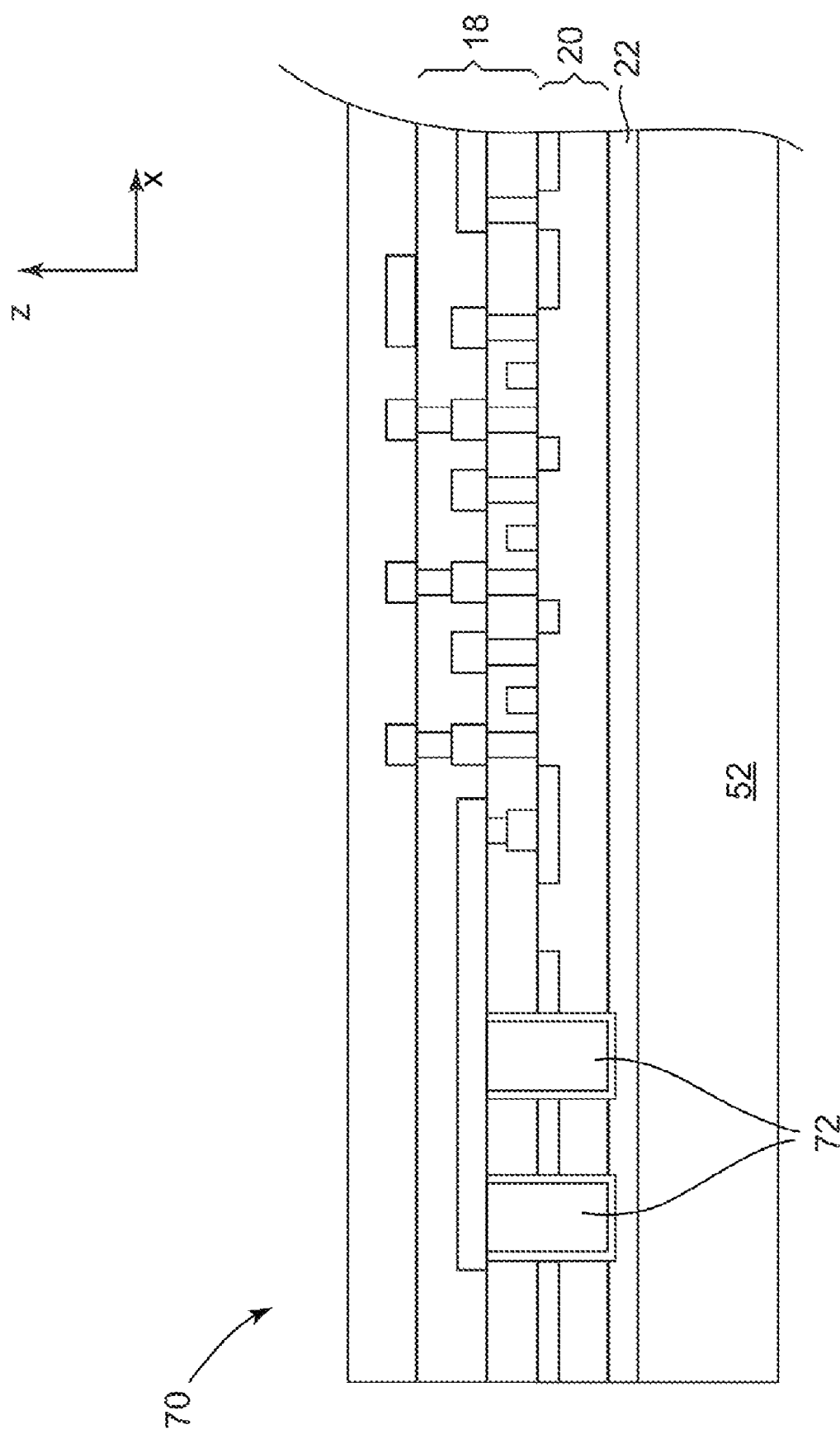
FIG. 11 is a schematic side-view diagram of another example device wafer that may be used to manufacture a neutron detector.

FIG. 11 illustrates an example device wafer 70 that is used to form another example neutron detector 80 (FIG. 12) having another configuration of electrically conductive pathways, such as vias 72. Like device wafer 50 described above with respect to FIG. 3, the example device wafer 70 of FIG. 11 comprises a substrate 52, an insulator layer 22, such as an oxide layer, for example a buried oxide (BOX) layer 22 deposited directly on substrate 52, an active semiconductor layer 20 deposited directly on BOX layer 22, and at least one interconnect layer 18 deposited on (e.g., directly adjacent) active semiconductor layer 20. Substrate 52, BOX layer 22, active semiconductor layer 20, and interconnect layer 18 of device wafer 70 and neutron detector 80 are substantially similar in function to those described above with respect to device wafer 50 and neutron detector 10 with respect to FIGS. 1-10. For this reason, these components of device wafer 70 and neutron detector 80 are labeled with the same reference numerals as are used above for device wafer 50. Device wafer 70 of the example shown in FIG. 11 also comprises at least one pre-formed via 72 that extends from interconnect layer 18 through active semiconductor layer 20. However, in the example shown in FIG. 11, vias 72 do not extend through BOX layer 22, as compared to vias 30 of example device wafer 50 (FIG. 3) that also extend through BOX layer 22. Vias 72 stop at BOX layer 22 and are covered by BOX layer 22. In some examples, vias 72 may also have a larger width, which may be measured in the x,y direction (orthogonal x-z axes are shown in FIG. 11 to aid the description) than the vias 30 for device wafer 50 (FIG. 3). As described in more detail below, the wider vias 72 provide a larger surface area, which may aid the formation of an electrical connection between bond pad 28 and via 72 within an opening formed in BOX layer 22 to access via 72.

Figure 12:
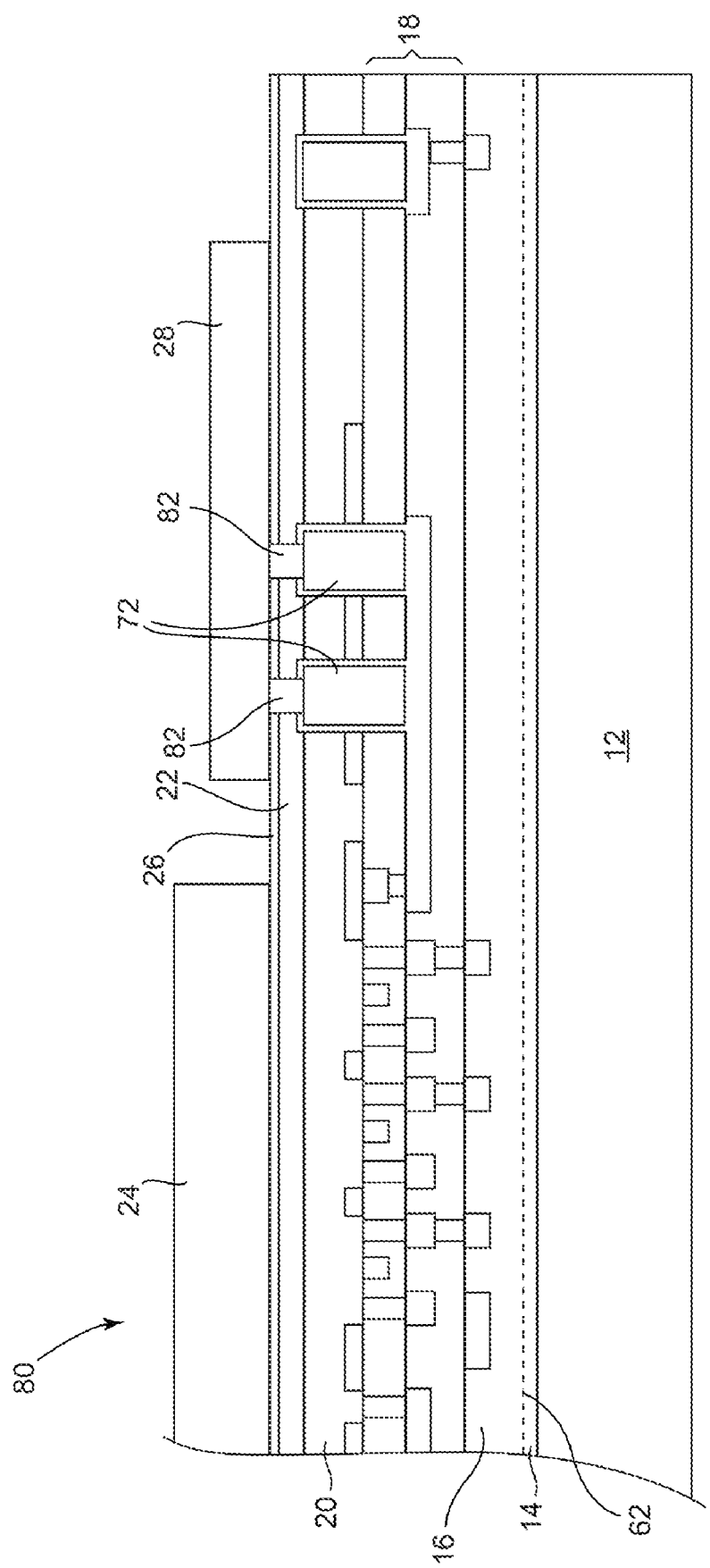
FIG. 12 is a schematic side-view diagram of another neutron detector made from the device wafer of FIG. 11.

Device wafer 70 may be processed by the same steps described in connection to FIGS. 3-9 above with respect to device wafer 50 and neutron detector 10. For example, device wafer 70 may be bonded by a circuit transfer bond to a handle wafer 60, substrate 52 may be removed, and a barrier layer 26, bond pads 28, and a neutron conversion layer 24 may be deposited on BOX layer 22. An example of a resulting neutron detector 80 formed from device wafer 70 is shown in FIG. 12. As shown in the example of FIG. 12, barrier layer 26 is deposited on top of BOX layer 22, and an opening is formed through barrier layer 26 and BOX layer 22 to expose vias 72, e.g., in a similar manner in which the opening in barrier layer 26 to access vias 30 is described above with respect to FIG. 8. After exposing vias 72 through barrier layer 26 and BOX layer 22, back contact 82 is deposited, which can be, for example a tungsten back contact material that fills the openings and contacts vias 72. Material defining bond pads 28 is then deposited over barrier layer 26 to define bond pads 28 that are in contact with back contacts 82 in order to electrically connect bond pads 28 to vias 72, and hence to interconnect layer 18. As described above with respect to FIG. 7, in some examples, bond pad 28 may be formed by depositing and then patterning the material of bond pad 28, such as by etching, or bond pad 28 may be formed by shadow masking so that only the desired position of bond pad 28 is exposed. Other techniques for defining bond pad 28 are contemplated. As shown in FIG. 12, a neutron conversion layer 24 is also deposited on barrier layer 26. Neutron conversion layer 24 of neutron detector 80 may be deposited by the same methods as described above with respect to FIG. 9 for the neutron conversion layer 24 of neutron detector 10.

Figure 13:
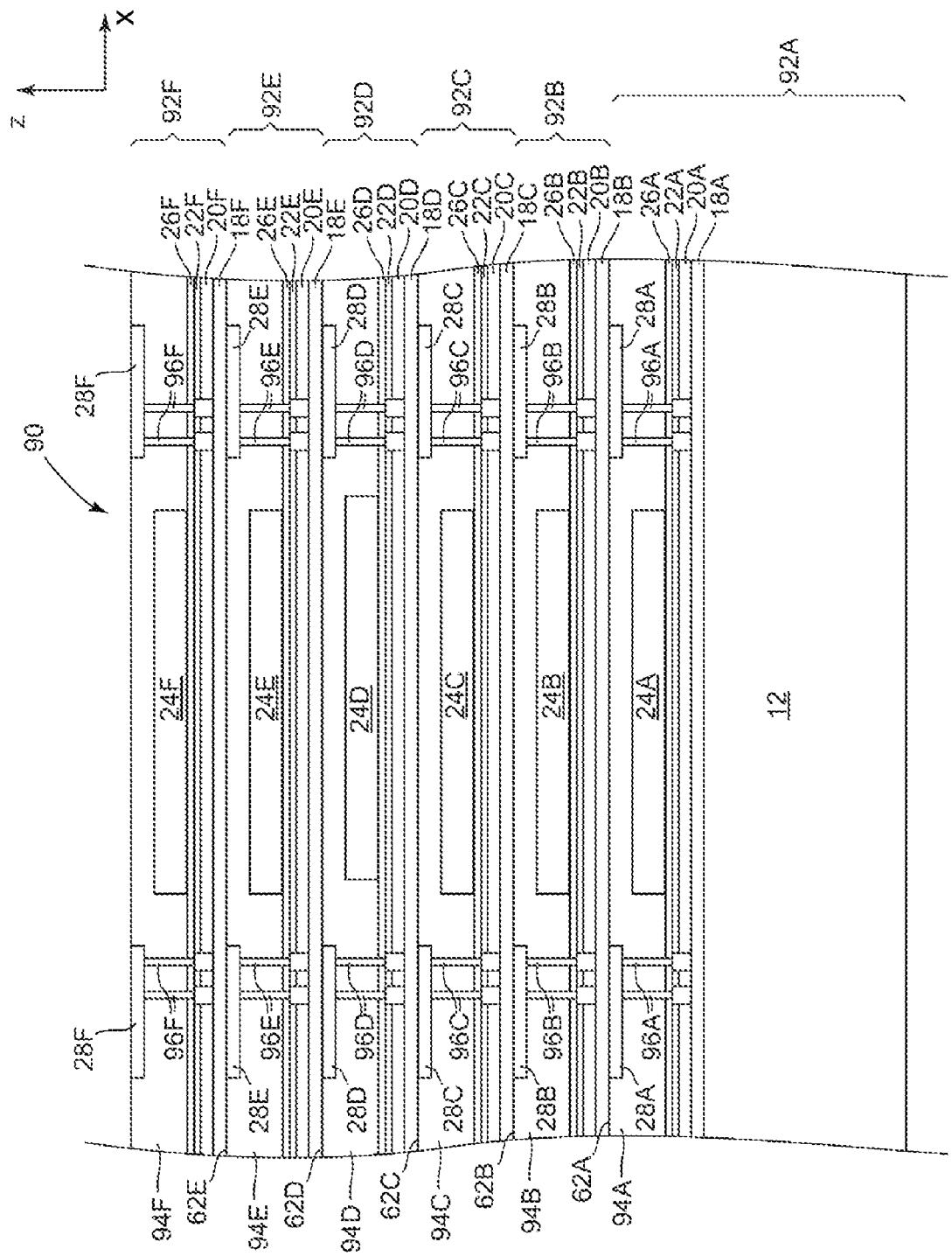
FIG. 13 is a schematic side-view diagram of a neutron detector comprising a stack of a plurality of neutron detection devices.

FIG. 13 shows an example a neutron detector 90 comprising a stack of a plurality of neutron detection devices 92A, 92B, 92C, 92D, 92E, 92F (collectively referred to herein as "neutron detection device(s) 92") stacked one on top of another in a z-axis direction (orthogonal x-z axes are shown in FIG. 13 to aid the description of FIG. 13) and bonded together. Each neutron detection device 92 may be structurally and functionally identical to individual neutron detector 10 (FIG. 1), with each neutron detection device 92 comprising a respective BOX layer 22A, 22B, 22C, 22D, 22E, 22F (collectively referred to herein as "BOX layer(s) 22") with a respective active semiconductor layer 20A, 20B, 20C, 20D, 20E, 20F (collectively referred to herein as "active semiconductor layer(s) 20") and a respective interconnect layer 18A, 18B, 18C, 18D, 18E, 18F (collectively referred to herein as "interconnect layer(s) 18") on one side of BOX layer 22 and a respective barrier layer 26A, 26B, 26C, 26D, 26E, 26F (collectively referred to herein as "barrier layer(s) 26") and a respective neutron conversion layer 24A, 24B, 24C, 24D, 24E, 24F (collectively referred to herein as "neutron conversion layer(s) 24") on the other side of BOX layer 22. The stacked neutron detector 90 provides for increased sensitivity to neutrons because it provides a larger volume of neutron conversion material that may capture and convert neutrons that are incident upon neutron detector 90.

The first neutron detection device 90A may be made by the same method described above to make neutron detector 10 (FIGS. 3-9) on a substrate 12. In one example, after first neutron detection device 90A is made, a dielectric layer 94A is deposited over neutron conversion layer 24A and one or more interstack vias 96A are formed that extend through dielectric layer 94A. In one example, dielectric layer 94A comprises a dielectric material, such as TEOS oxide deposited via high-density plasma deposition. After the dielectric material of dielectric layer 94A is deposited, the dielectric material is planarized, such as by chemical-mechanical planarization ("CMP"). Interstack vias 96A are also formed through dielectric layer 94A, such as by etching through dielectric layer 94A and depositing an electrically conductive material, such as tungsten, to form interstack vias 96A. Bond pads 28A may be formed on or in dielectric layer 94A at a top surface (in the z-axis direction) of dielectric layer 94A. Bond pads 28A may be formed by patterning dielectric layer 94A, such as by etching, followed by depositing an electrically conductive material, such as a copper damascene material or an AlCu alloy, to form bond pads 28A. Dielectric layer 94A electrically isolates interstack vias 96A and bond pads 28A from neutron conversion layer 24A. Interstack vias 96A electrically connect one or more bond pads 28A to interconnect layer 18A of first neutron detection device 92A.

Next, a device wafer (not shown), similar to device wafer 50 described above with respect to FIG. 3, is bonded to first neutron conversion device 92A by a circuit transfer bond 62A between interconnect layer 18B of the device wafer and the top surface of dielectric layer 94A, similar to the bonding described above with respect to FIG. 5. In this way, first neutron detection device 92A acts as the "handle wafer" for the formation of second neutron detection device 92B. In one example, circuit transfer bond 62A is a metal-to-metal bond formed between a metal contact on first neutron detection device 92A and a metal contact on second neutron detection device 92B. In one example, shown in FIG. 13, the metal-to-metal bond is formed between bond pads 28A and a metal portion of interconnect layer 18B of second neutron detection device 92B. Examples of metal-to-metal bonds are described in more detail above with respect to FIG. 5.

In another example, circuit transfer bond 62A is an oxide-to-oxide bond formed between dielectric layer 94A of first neutron detection device 92A and a dielectric contact layer (not shown) deposited on interconnect layer 18B of second neutron detection device 92B. In such an example, one or more vias (not shown) are formed that extend through the dielectric contact layer to provide an electrical connection between interconnect layer 18A of first neutron detection device 92A and interconnect layer 18B of second neutron detection device 92B. Examples of oxide-to-oxide bonds are described in more detail above with respect to FIG. 5.

After circuit transfer bond 62A is formed between first neutron detection device 92A and the device wafer, the substrate of the device wafer (not shown) is removed down to BOX layer 22B, similar to the method described above with respect to FIG. 6. A barrier layer 26B and a neutron conversion layer 24B are deposited onto BOX layer 22B, similar to the method described above with respect to FIGS. 7-9. A second dielectric layer 94B is deposited over neutron conversion layer 24B and barrier layer 26B in the same way dielectric layer 94A was deposited over neutron conversion layer 24A and barrier layer 26A. Dielectric layer 94B is planarized and interstack vias 96B are formed in dielectric layer 94B, similar to the method describe above for dielectric layer 94A and interstack vias 96A. Bond pads 28B are formed on dielectric layer 94B and are electrically connected to interconnect layer 18B of second neutron detection device 92B through interstack vias 96B. In this way, bond pads 28B are electrically connected to active semiconductor layer 20B of second neutron detection device 92B through vias 96B and interconnect layer 18B. Bond pads 28B are further connected to active semiconductor layer 20A of first neutron detection device 92A through bond pads 28A, interstack vias 96A, and interconnect layer 18A.

The process can be repeated with additional device wafers to form additional neutron detection devices 92C, 92D, 92E, and 92F, as shown in FIG. 13. Through the electrical connection provided by interstack vias 96, bond pads 28, and interconnect layers 18, the plurality of active semiconductor layers 20 of the neutron detection devices 92 are connected together so that detection of a secondary charged particle 38 by the charge-sensitive array of any of the neutron detection devices 92 will be reported to outside circuitry via a connection from the top-most bond pads 28F to the outside circuitry, such as through a wire bond connection.

Figure 14:
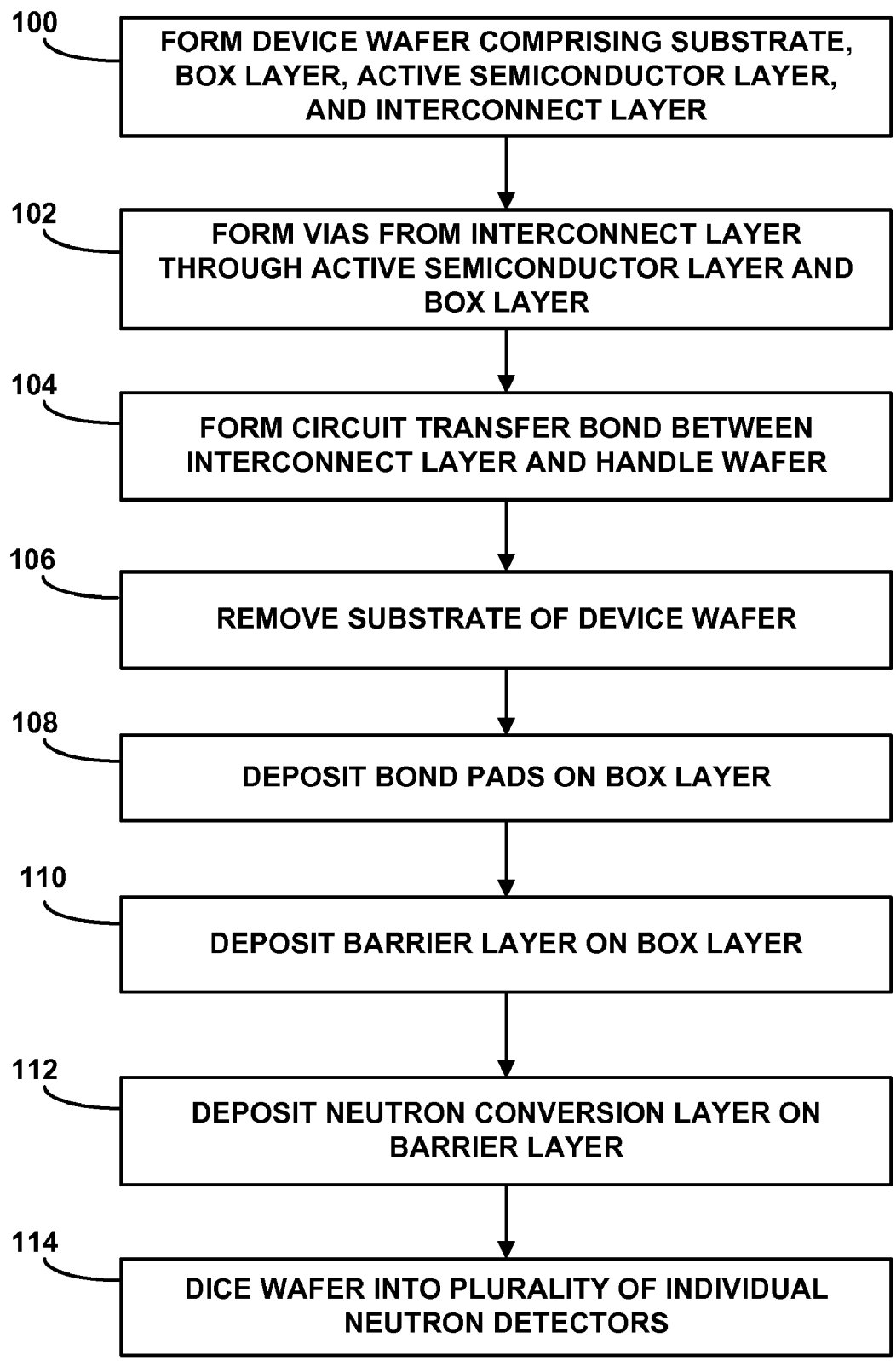
FIG. 14 is a flow diagram of an example method of making a neutron detector.

An example method of making a neutron detector 10, 80 is shown in the flow diagram of FIG. 14. The example method comprises forming device wafer 50 (100) by at least forming an oxide layer, such as BOX layer 22, on a substrate 52 (e.g., directly adjacent to substrate 52), forming an active semiconductor layer 20 on BOX layer 22 (e.g., directly adjacent to BOX layer 22), and forming an interconnect layer 18 on active semiconductor layer 20 (e.g., directly adjacent to semiconductor layer 20). At least one electrically conductive pathway, such as via 30, 72 is also formed (102), where the via extends from interconnect layer 18 through active semiconductor layer 20 and BOX layer 22. In one example, the electrically conductive pathway, such as vias 30, 72, are preformed during the fabrication of device wafer 50. A circuit transfer bond 62 is formed (104) between interconnect layer 18 of device wafer 50 and a handle wafer 60. After the formation of circuit transfer bond (104), substrate 52 is removed from device wafer 50 (106). In one example, the at least one electrically conductive pathway is formed (102) after the formation of circuit transfer bond 62 (104) and after the removal of substrate (106), such as by forming a through semiconductor via (TSVs) through BOX layer 22, active semiconductor layer 20, and at least partially into interconnect layer 18 in order to land on an electrically conductive material in interconnect layer 18, such as a connection pad (not shown). After substrate 52 is removed (106), a bond pad 28 is deposited on BOX layer 22 (e.g. directly adjacent to BOX layer 22) (108), wherein bond pad 28 is electrically connected to via 30. Also after substrate 52 is removed (106), a barrier layer 26 is deposited on BOX layer 22 (110). After barrier layer 26 is deposited (110), a neutron conversion layer 24 is deposited on barrier layer 26 (112). If device wafer 50 comprised a plurality of individual dice in order to form a plurality of individual neutron detectors 10, then the wafer may be diced into the plurality of neutron detectors 10 (114).

As described above with respect to FIG. 5, forming circuit transfer bond 62 between device wafer 50 and handle wafer 60 (104) may comprise forming an oxide-to-oxide bond, such as an oxide-to-oxide bond between a dielectric contact layer 14 on handle wafer 60 and a dielectric contact layer 16 on interconnect layer 18 of device wafer 50. Alternatively, forming circuit transfer bond 62 (104) may also comprise forming a metal-to-metal bond, such as a metal-to-metal bond between a metal contact layer 14 of handle wafer 60 and either metal portions of interconnect layer 18 or a metal contact layer 16 deposited on interconnect layer 18.

This disclosure refers to illustrative examples that are not meant to be construed in a limiting sense. Various modifications of the illustrative examples, as well as additional examples in line with the disclosure, will be apparent to persons skilled in the art upon reference to this description. Any specific numerical value or range described in the foregoing disclosure shall not be limiting, except for values or ranges included in the following claims.

The invention claimed is:

1. A method of manufacturing a neutron detector, the method comprising:

forming a first wafer by at least forming an oxide layer on a substrate, forming an active semiconductor layer on the oxide layer, and forming an interconnect layer on the active semiconductor layer;

forming at least one electrically conductive pathway extending from the interconnect layer through the active semiconductor layer and the oxide layer;

forming a circuit transfer bond between the interconnect layer of the first wafer and a second wafer;

after forming the circuit transfer bond, removing the substrate of the first wafer;

after removing the substrate of the first wafer, depositing a bond pad on the oxide layer of the first wafer, the bond pad being electrically connected to the electrically conductive pathway;

after removing the substrate of the first wafer, depositing a barrier layer on the oxide layer of the first wafer; and after depositing the barrier layer, depositing a neutron conversion layer on the barrier layer.

2. The method of claim 1, wherein forming the first wafer includes forming a dielectric layer on the interconnect layer, wherein the second wafer comprises an oxide contact layer, and forming the circuit transfer bond comprises forming an oxide-to-oxide bond between the dielectric layer of the first wafer and the oxide contact layer of the second wafer.

3. The method of claim 1, wherein forming the first wafer includes forming a metal layer on the interconnect layer, wherein the second wafer comprises a metal contact layer, and forming the circuit transfer bond comprises forming a metal-to-metal bond between the metal layer of the first wafer and the metal contact layer of the second wafer.

4. The method of claim 1, wherein forming the at least one electrically conductive pathway comprises forming the at least one electrically conductive pathway to extend from the interconnect layer through the active semiconductor layer and the oxide layer during formation of the first wafer and prior to forming the circuit transfer bond between the interconnect layer of the first wafer and the second wafer.

5. The method of claim 1, wherein forming the at least one electrically conductive pathway comprises forming the at least one electrically conductive pathway to extend from the interconnect layer through the active semiconductor layer during formation of the first wafer and prior to forming the circuit transfer bond between the interconnect layer of the first wafer and the second wafer, the method further comprising:

patterning an opening through the oxide layer to expose the at least one electrically conductive pathway after removing the substrate of the first wafer; and depositing an electrically conductive contact in the opening.

6. The method of claim 1, wherein forming the at least one electrically conductive pathway comprises:

patterning an opening in the oxide layer and active semiconductor layer after removing the substrate of the first wafer; and depositing at least one via comprising an electrically conductive material in the opening in the oxide layer and active semiconductor layer.

7. The method of claim 1, wherein the circuit transfer bond is configured to maintain a mechanical bond between the interconnect layer and the second wafer during removal of the substrate of the first wafer and deposition of the bond pad, deposition of the barrier layer, and deposition of the neutron conversion layer.

8. The method of claim 1, wherein removing the substrate of the first wafer comprises at least one of grinding, chemical-mechanical polishing, or chemical etching the substrate.

9. The method of claim 1, wherein depositing the bond pad on the oxide layer of the first wafer comprises depositing the bond pad over an exposed portion of the at least one electrically conductive pathway.

10. The method of claim 9, wherein depositing the barrier layer on the oxide layer further comprises depositing the barrier layer over a portion of the bond pad.

11. The method of claim 1, further comprising:
patterning an opening through the barrier layer to expose the at least one electrically conductive pathway after depositing the barrier layer; and
depositing a contact in the opening, wherein depositing the bond pad comprises depositing the bond pad over the contact and the barrier layer.

12. The method of claim 1, further comprising patterning the neutron conversion layer.

13. The method of claim 12, wherein patterning the neutron conversion layer comprises at least one of: forming a shadow mask on the barrier layer and depositing a neutron conversion material through the shadow mask, photo-lithography, or etching.

14. The method of claim 1, wherein forming the first wafer, forming the at least one electrically conductive pathway, forming the circuit transfer bond, removing the substrate of the first wafer, depositing the bond pad, and depositing a barrier layer on the oxide layer of the first wafer are all performed in a first manufacturing facility, and wherein depositing the neutron conversion layer is performed in a second manufacturing facility.

15. The method of claim 1, further comprising dicing the device into a plurality of individual neutron detectors.

16. The method of claim 1,
wherein, after depositing the neutron conversion layer, the first wafer comprises a first interconnect layer on a first substrate, a first active semiconductor layer on the first interconnect layer, a first oxide layer on the first active semiconductor layer, a first bond pad on the first oxide layer, a first electrically conductive pathway, a first barrier layer on the first oxide layer, and a first neutron conversion layer on the first barrier layer, the method further comprising:
depositing a contact layer over the first neutron conversion layer, the first bond pad, and the first barrier layer;
forming a third wafer by at least forming a second oxide layer on a second substrate, forming a second active semiconductor layer on the second oxide layer, and forming a second interconnect layer on the second active semiconductor layer;
forming at least one second electrically conductive pathway extending from the second interconnect layer through the second active semiconductor layer and the second oxide layer of the third wafer;
forming a second circuit transfer bond between the second interconnect layer and the contact layer;
after forming the second circuit transfer bond, removing the second substrate of the third wafer;
after removing the second substrate of the third wafer, depositing a second bond pad on the second oxide layer of the third wafer, the second bond pad being electrically connected to the at least one second electrically conductive pathway of the third wafer;
after removing the second substrate of the third wafer, depositing a second barrier layer on the second oxide layer of the third wafer; and
after depositing the second barrier layer, depositing a second neutron conversion layer on the second barrier layer.

17. A semiconductor device comprising:
a first wafer comprising:
a substrate;
an oxide layer on the substrate;
an active semiconductor layer on the oxide layer;
an interconnect layer on the active semiconductor layer, wherein the active semiconductor layer comprises an array of charge-sensitive circuits configured to detect a secondary charged particle; and
a metal layer on the interconnect layer;
a second wafer comprising a substrate, a contact layer, and a metal contact layer on the substrate; and
a circuit transfer bond formed between the interconnect layer of the first wafer and the contact layer of the second wafer, wherein the circuit transfer bond comprises a metal-to-metal bond between the metal layer of the first wafer and the metal contact layer of the second wafer.

18. The semiconductor device of claim 17, wherein the first wafer further comprises at least one electrically conductive pathway extending from the interconnect layer.

* * * * *